United States Patent
Bismuto et al.

(10) Patent No.: US 11,777,279 B2
(45) Date of Patent: *Oct. 3, 2023

(54) LASER ARCHITECTURES USING QUANTUM WELL INTERMIXING TECHNIQUES

(71) Applicant: Apple Inc., Cupertino, CA (US)

(72) Inventors: Alfredo Bismuto, Sunnyvale, CA (US); Mark Alan Arbore, Los Altos, CA (US); Ross M. Audet, Menlo Park, CA (US)

(73) Assignee: Apple Inc., Cupertino, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/478,670

(22) Filed: Sep. 17, 2021

(65) Prior Publication Data
US 2022/0006267 A1 Jan. 6, 2022

Related U.S. Application Data

(63) Continuation of application No. 16/649,965, filed as application No. PCT/US2018/052679 on Sep. 25, 2018, now Pat. No. 11,158,996.
(Continued)

(51) Int. Cl.
*H01S 5/00* (2006.01)
*H01S 5/40* (2006.01)
(Continued)

(52) U.S. Cl.
CPC ........ *H01S 5/4087* (2013.01); *H01S 5/04256* (2019.08); *H01S 5/162* (2013.01);
(Continued)

(58) Field of Classification Search
CPC .... H01S 5/4087; H01S 5/04256; H01S 5/162; H01S 5/2059; H01S 5/2228; H01S 5/3414
See application file for complete search history.

(56) References Cited

U.S. PATENT DOCUMENTS

| 4,227,091 A | 10/1980 | Sick |
| 4,318,058 A * | 3/1982 | Mito ...................... H01S 5/125 |
| | | 372/50.12 |

(Continued)

FOREIGN PATENT DOCUMENTS

| CN | 104614084 | 5/2015 |
| EP | 1403985 | 3/2004 |

(Continued)

OTHER PUBLICATIONS

Lee, S.K. et al. (Apr. 1985). "A Multi-Touch Three Dimensional Touch-Sensitive Tablet," Proceedings of CHI: ACM Conference on Human Factors in Computing Systems, pp. 21-25.
(Continued)

*Primary Examiner* — Kinam Park
(74) *Attorney, Agent, or Firm* — Brownstein Hyatt Farber Schreck, LLP

(57) ABSTRACT

A laser chip including a plurality of stripes is disclosed, where a laser stripe can be grown with an initial optical gain profile, and its optical gain profile can be shifted by using an intermixing process. In this manner, multiple laser stripes can be formed on the same laser chip from the same epitaxial wafer, where at least one laser stripe can have an optical gain profile shifted relative to another laser stripe. For example, each laser stripe can have a shifted optical gain profile relative to its neighboring laser stripe, thereby each laser stripe can emit light with a different range of wavelengths. The laser chip can emit light across a wide range of wavelengths. Examples of the disclosure further includes different regions of a given laser stripe having different intermixing amounts.

20 Claims, 14 Drawing Sheets

Related U.S. Application Data

(60) Provisional application No. 62/564,419, filed on Sep. 28, 2017.

(51) Int. Cl.
 *H01S 5/042*   (2006.01)
 *H01S 5/20*    (2006.01)
 *H01S 5/22*    (2006.01)
 *H01S 5/34*    (2006.01)
 *H01S 5/16*    (2006.01)

(52) U.S. Cl.
 CPC .......... *H01S 5/2059* (2013.01); *H01S 5/2228* (2013.01); *H01S 5/3414* (2013.01)

(56) References Cited

U.S. PATENT DOCUMENTS

| | | | |
|---|---|---|---|
| 4,880,304 A | 11/1989 | Jaeb | |
| 4,896,325 A | 1/1990 | Coldren | |
| 5,140,605 A | 8/1992 | Paoli | |
| 5,287,376 A * | 2/1994 | Paoli | H01S 5/4031 372/50.122 |
| 5,325,392 A | 6/1994 | Tohmori | |
| 5,341,391 A | 8/1994 | Ishimura | |
| 5,384,797 A * | 1/1995 | Welch | H01S 5/4031 372/50.12 |
| 5,483,261 A | 1/1996 | Yasutake | |
| 5,488,204 A | 1/1996 | Mead et al. | |
| 5,488,678 A | 1/1996 | Taneya | |
| 5,515,391 A | 5/1996 | Endriz | |
| 5,644,667 A | 7/1997 | Tabuchi | |
| 5,695,520 A | 12/1997 | Bruckner et al. | |
| 5,708,674 A * | 1/1998 | Beernink | B82Y 20/00 372/50.12 |
| 5,742,631 A | 4/1998 | Paoli | |
| 5,780,875 A | 7/1998 | Tsuji | |
| 5,825,352 A | 10/1998 | Bisset et al. | |
| 5,835,079 A | 11/1998 | Shieh | |
| 5,850,411 A * | 12/1998 | Major, Jr. | H01S 5/34326 372/45.01 |
| 5,880,411 A | 3/1999 | Gillespie et al. | |
| 5,915,165 A | 6/1999 | Sun | |
| 6,043,104 A * | 3/2000 | Uchida | H01S 5/1021 372/50.1 |
| 6,122,042 A | 9/2000 | Wunderman et al. | |
| 6,188,391 B1 | 2/2001 | Seely et al. | |
| 6,263,222 B1 | 7/2001 | Diab | |
| 6,310,610 B1 | 10/2001 | Beaton et al. | |
| 6,323,846 B1 | 11/2001 | Westerman et al. | |
| 6,330,378 B1 | 12/2001 | Forrest | |
| 6,341,116 B1 | 1/2002 | Lee | |
| 6,345,135 B1 | 2/2002 | Reid | |
| 6,373,872 B2 | 4/2002 | Deacon | |
| 6,393,185 B1 | 5/2002 | Deacon | |
| 6,475,153 B1 | 11/2002 | Khair et al. | |
| 6,516,017 B1 | 2/2003 | Matsumoto | |
| 6,558,335 B1 | 5/2003 | Thede | |
| 6,594,409 B2 | 7/2003 | Dutt et al. | |
| 6,605,045 B2 | 8/2003 | Ohsaki et al. | |
| 6,628,686 B1 | 9/2003 | Sargent | |
| 6,647,032 B1 | 11/2003 | Lee et al. | |
| 6,657,723 B2 | 12/2003 | Cohen | |
| 6,690,387 B2 | 2/2004 | Zimmerman et al. | |
| 6,690,693 B1 | 2/2004 | Crowder | |
| 6,699,199 B2 | 3/2004 | Asada et al. | |
| 6,788,719 B2 | 9/2004 | Crowder | |
| 6,795,453 B2 | 9/2004 | Pezeshki et al. | |
| 6,795,622 B2 | 9/2004 | Forrest | |
| 6,803,604 B2 | 10/2004 | Takahashi et al. | |
| 6,807,206 B2 | 10/2004 | Tuskiji et al. | |
| 6,816,529 B2 | 11/2004 | Vail | |
| 6,892,449 B1 | 5/2005 | Brophy et al. | |
| 6,911,629 B2 | 6/2005 | Lano et al. | |
| 6,915,955 B2 | 7/2005 | Jung | |
| 6,940,182 B2 | 9/2005 | Hilton et al. | |
| 6,947,639 B2 | 9/2005 | Singh | |
| 6,952,504 B2 | 10/2005 | Bi | |
| 6,987,906 B2 | 1/2006 | Nakama et al. | |
| 6,990,129 B2 | 1/2006 | Buimovich et al. | |
| 7,015,894 B2 | 3/2006 | Morohoshi | |
| 7,054,517 B2 | 5/2006 | Mossberg | |
| 7,058,245 B2 | 6/2006 | Farahi | |
| 7,079,715 B2 | 7/2006 | Kish | |
| 7,106,778 B2 | 9/2006 | Reid | |
| 7,130,325 B2 | 10/2006 | Oh et al. | |
| 7,184,064 B2 | 2/2007 | Zimmerman et al. | |
| 7,189,011 B2 | 3/2007 | Harker | |
| 7,196,355 B2 | 3/2007 | De La Grandiere et al. | |
| 7,203,401 B2 | 4/2007 | Mossberg | |
| 7,203,426 B2 | 4/2007 | Wu et al. | |
| 7,209,611 B2 | 4/2007 | Joyner | |
| 7,245,379 B2 | 7/2007 | Schwabe | |
| 7,283,242 B2 | 10/2007 | Thornton | |
| 7,283,694 B2 | 10/2007 | Welch | |
| 7,314,451 B2 | 1/2008 | Halperin et al. | |
| 7,324,195 B2 | 1/2008 | Packirisamy et al. | |
| 7,366,364 B2 | 4/2008 | Singh | |
| 7,447,393 B2 | 11/2008 | Yan | |
| 7,460,742 B2 | 12/2008 | Joyner | |
| 7,468,637 B2 | 12/2008 | Braun et al. | |
| 7,469,092 B2 | 12/2008 | Sappey et al. | |
| 7,477,384 B2 | 1/2009 | Schwabe | |
| 7,480,317 B2 | 1/2009 | Hu et al. | |
| 7,483,453 B2 | 1/2009 | Diffily et al. | |
| 7,483,599 B2 | 1/2009 | Dominic et al. | |
| 7,526,007 B2 | 4/2009 | Chua et al. | |
| 7,558,301 B2 | 7/2009 | Lin et al. | |
| 7,616,110 B2 | 11/2009 | Crump et al. | |
| 7,620,078 B2 | 11/2009 | Mori | |
| 7,663,607 B2 | 2/2010 | Hotelling et al. | |
| 7,664,156 B2 | 2/2010 | Yamazaki | |
| 7,680,364 B2 | 3/2010 | Nilsson | |
| 7,701,985 B2 | 4/2010 | Webster et al. | |
| 7,720,328 B2 | 5/2010 | Yan | |
| 7,738,935 B1 | 6/2010 | Turcott | |
| 7,751,658 B2 | 7/2010 | Welch et al. | |
| 7,885,302 B2 | 2/2011 | Eberhard | |
| 7,885,492 B2 | 2/2011 | Welch | |
| 7,903,704 B2 | 3/2011 | Patel et al. | |
| 7,974,504 B2 | 7/2011 | Nagarajan | |
| 8,000,368 B2 | 8/2011 | Pezeshki | |
| 8,121,169 B2 | 2/2012 | Nguyen et al. | |
| 8,222,084 B2 | 7/2012 | Dallesasse et al. | |
| 8,259,770 B2 | 9/2012 | Tagansky | |
| 8,279,441 B2 | 10/2012 | Brown | |
| 8,300,994 B2 | 10/2012 | Welch et al. | |
| 8,320,763 B2 | 11/2012 | Kim et al. | |
| 8,352,008 B2 | 1/2013 | Kuhn et al. | |
| 8,378,811 B2 | 2/2013 | Crump et al. | |
| 8,405,699 B2 | 3/2013 | Niwa et al. | |
| 8,437,825 B2 | 5/2013 | Dalvi et al. | |
| 8,442,608 B2 | 5/2013 | Pav | |
| 8,457,172 B2 | 6/2013 | Reid et al. | |
| 8,479,122 B2 | 7/2013 | Hotelling et al. | |
| 8,559,775 B2 | 10/2013 | Babie et al. | |
| 8,564,784 B2 | 10/2013 | Wang et al. | |
| 8,588,266 B2 | 11/2013 | Fujii | |
| 8,618,930 B2 | 12/2013 | Papadopoulos et al. | |
| 8,649,839 B2 | 2/2014 | Chin | |
| 8,724,100 B1 | 5/2014 | Asghari et al. | |
| 8,750,341 B2 | 6/2014 | Bazzani | |
| 8,774,243 B2 | 7/2014 | Kim et al. | |
| 8,781,548 B2 | 7/2014 | Besko et al. | |
| 8,886,465 B2 | 11/2014 | Cinbis et al. | |
| 8,920,332 B2 | 12/2014 | Hong et al. | |
| 8,954,135 B2 | 2/2015 | Yuen et al. | |
| 8,964,806 B2 | 2/2015 | Ensher et al. | |
| 8,983,250 B2 | 3/2015 | Black et al. | |
| 8,995,483 B2 | 3/2015 | Diehl et al. | |
| 9,020,004 B2 | 4/2015 | Jeong | |
| 9,031,412 B2 | 5/2015 | Nagarajan | |
| 9,065,251 B2 | 6/2015 | Fukuda et al. | |
| 9,093,813 B2 | 7/2015 | Pushkarsky et al. | |

(56) References Cited

U.S. PATENT DOCUMENTS

| | | |
|---|---|---|
| 9,110,259 B1 | 8/2015 | Black |
| 9,135,397 B2 | 9/2015 | Denyer et al. |
| 9,172,211 B2 | 10/2015 | Kuksenkov et al. |
| 9,176,282 B2 | 11/2015 | Pottier |
| 9,209,602 B2 | 12/2015 | Davies et al. |
| 9,217,669 B2 | 12/2015 | Wu et al. |
| 9,348,154 B2 | 5/2016 | Hayakawa |
| 9,370,689 B2 | 6/2016 | Guillama et al. |
| 9,405,066 B2 | 8/2016 | Mahgerefteh |
| 9,425,365 B2 | 8/2016 | Kurtin |
| 9,526,421 B2 | 12/2016 | Papadopoulos et al. |
| 9,526,431 B2 | 12/2016 | Zakharov et al. |
| 9,529,160 B2 | 12/2016 | Orcutt et al. |
| 9,543,736 B1 | 1/2017 | Barwicz et al. |
| 9,595,804 B2 | 3/2017 | Minneman et al. |
| 9,620,931 B2 | 4/2017 | Tanaka |
| 9,643,181 B1 | 5/2017 | Chang |
| 9,755,399 B2 | 9/2017 | Tulip |
| 9,759,652 B2 | 9/2017 | Yu |
| 9,766,370 B2 | 9/2017 | Aloe et al. |
| 9,780,266 B2 | 10/2017 | Lotito et al. |
| 9,804,027 B2 | 10/2017 | Fish |
| 9,829,631 B2 | 11/2017 | Lambert |
| 9,880,352 B2 | 1/2018 | Florjanczyk |
| 9,882,073 B2 | 1/2018 | Krasulick et al. |
| 9,883,824 B2 | 2/2018 | Tiao |
| 9,888,838 B2 | 2/2018 | Ito et al. |
| 9,935,426 B2 | 4/2018 | Kaneko |
| 9,943,237 B2 | 4/2018 | Baker et al. |
| 9,948,063 B2 | 4/2018 | Caneau et al. |
| 10,004,408 B2 | 6/2018 | Naima |
| 10,009,668 B2 | 6/2018 | Liboiron-Ladouceur |
| 10,060,788 B2 | 8/2018 | Fei |
| 10,098,555 B2 | 10/2018 | Yamaji |
| 10,132,996 B2 | 11/2018 | Lambert |
| 10,181,696 B2 | 1/2019 | Evans et al. |
| 10,215,698 B2 | 2/2019 | Han et al. |
| 10,238,351 B2 | 3/2019 | Halperin et al. |
| 10,285,898 B2 | 5/2019 | Douglas et al. |
| 10,310,196 B2 | 6/2019 | Hutchison |
| 10,319,878 B2 | 6/2019 | Ulmer et al. |
| 10,413,362 B2 | 9/2019 | Griffin |
| 10,429,597 B2 | 10/2019 | ten Have et al. |
| 10,433,739 B2 | 10/2019 | Weekly et al. |
| 10,529,003 B2 | 1/2020 | Mazed |
| 10,535,979 B2 | 1/2020 | Audet et al. |
| 10,687,718 B2 | 6/2020 | Allec et al. |
| 10,697,830 B1 | 6/2020 | Kangas et al. |
| 10,788,368 B1 | 9/2020 | Pelc et al. |
| 10,852,492 B1 | 12/2020 | Vermeulen et al. |
| 11,064,592 B1 | 7/2021 | Bismuto et al. |
| 11,158,996 B2 * | 10/2021 | Bismuto ............ H01S 5/4087 |
| 11,171,464 B1 | 11/2021 | Bishop et al. |
| 11,275,405 B2 | 3/2022 | Hotelling |
| 11,437,779 B2 | 9/2022 | Audet et al. |
| 2002/0181521 A1 | 12/2002 | Crowder et al. |
| 2004/0126117 A1 * | 7/2004 | Lo ..................... H01L 31/12 |
| | | 398/139 |
| 2004/0161206 A1 * | 8/2004 | Harker ............... G02B 6/4255 |
| | | 385/88 |
| 2004/0174915 A1 | 9/2004 | Sarlet et al. |
| 2004/0255318 A1 | 12/2004 | Braetberg et al. |
| 2005/0053112 A1 | 3/2005 | Shams-Zadeh-Amiri |
| 2005/0063431 A1 | 3/2005 | Gallup et al. |
| 2005/0169327 A1 | 8/2005 | Eden et al. |
| 2006/0002443 A1 | 1/2006 | Farber et al. |
| 2006/0088068 A1 | 4/2006 | Farrell et al. |
| 2007/0116076 A1 | 5/2007 | Wang et al. |
| 2008/0044128 A1 | 2/2008 | Kish et al. |
| 2008/0063016 A1 | 3/2008 | Bhatia et al. |
| 2008/0310470 A1 | 12/2008 | Ooi et al. |
| 2009/0086782 A1 | 4/2009 | Yokoyama et al. |
| 2013/0292571 A1 | 11/2013 | Mukherjee et al. |
| 2014/0029943 A1 | 1/2014 | Mathai et al. |
| 2016/0224750 A1 | 8/2016 | Kethman et al. |
| 2016/0296173 A1 | 10/2016 | Culbert |
| 2017/0033531 A1 | 2/2017 | Treese et al. |
| 2017/0045450 A1 | 2/2017 | Lieber et al. |
| 2017/0164878 A1 | 6/2017 | Connor |
| 2017/0249445 A1 | 8/2017 | Devries et al. |
| 2017/0325744 A1 | 11/2017 | Allec et al. |
| 2018/0054038 A1 | 2/2018 | Kim |
| 2018/0083421 A1 | 3/2018 | Audet et al. |
| 2018/0175587 A1 * | 6/2018 | Mathai ................ H01S 5/423 |
| 2018/0241174 A1 | 8/2018 | Weber |
| 2018/0242892 A1 | 8/2018 | Schie |
| 2019/0339468 A1 | 11/2019 | Evans |
| 2019/0342009 A1 | 11/2019 | Evans |
| 2020/0152615 A1 | 5/2020 | Krasulick et al. |
| 2020/0153202 A1 | 5/2020 | Audet et al. |
| 2020/0227895 A1 * | 7/2020 | Takigawa ............ H01S 5/3201 |
| 2020/0244045 A1 | 7/2020 | Bismuto et al. |
| 2020/0253547 A1 | 8/2020 | Harris et al. |
| 2020/0309593 A1 | 10/2020 | Bismuto et al. |
| 2021/0033805 A1 | 2/2021 | Bishop et al. |
| 2021/0199576 A1 | 7/2021 | Arbore et al. |
| 2021/0263216 A1 | 8/2021 | Bishop et al. |
| 2022/0131340 A1 | 4/2022 | Bishop et al. |

FOREIGN PATENT DOCUMENTS

| | | |
|---|---|---|
| EP | 1432045 | 6/2004 |
| EP | 1753104 | 2/2007 |
| EP | 2091118 | 8/2009 |
| EP | 2120301 | 11/2009 |
| EP | 2849294 | 3/2015 |
| EP | 2992821 | 3/2016 |
| GB | 2380058 | 3/2003 |
| JP | 04116878 | 4/1992 |
| JP | 2000163031 | 6/2000 |
| JP | 2002342033 | 11/2002 |
| JP | 2005175021 | 6/2005 |
| JP | 2008262118 | 10/2008 |
| JP | 2010503987 | 2/2010 |
| JP | 2015115411 | 6/2015 |
| WO | WO 96/011416 | 4/1996 |
| WO | WO 01/014929 | 3/2001 |
| WO | WO 04/031824 | 4/2004 |
| WO | WO 05/091036 | 9/2005 |
| WO | WO 08/033251 | 3/2008 |
| WO | WO 11/090274 | 7/2011 |
| WO | WO 16/144831 | 9/2016 |
| WO | WO 16/176364 | 11/2016 |
| WO | WO 17/040431 | 3/2017 |
| WO | WO 17/184420 | 10/2017 |
| WO | WO 17/184423 | 10/2017 |
| WO | WO 17/197033 | 11/2017 |
| WO | WO 19/152990 | 8/2019 |
| WO | WO 20/106974 | 5/2020 |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Tohmori, et al., "Broad-Range Wavelength-Tunable Superstructure Grating (SSG) DBR Lasers," *IEEE Journal of Quantum Electronics*, vol. 29, No. 6, Jun. 1993, pp. 1817-1823.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Gonzalez-Sanchez et al., "Capacitive Sensing for Non-Invasive Breathing and Heart Monitoring in Non-Restrained, Non-Sedated Laboratory Mice," Sensors 2016, vol. 16, No. 1052, pp. 1-16.

He et al., "Integrated Polarization Compensator for WDM Waveguide Demultiplexers," *IEEE Photonics Technology Letters* vol. 11, No. 2, Feb. 1999, pp. 224-226.

(56) References Cited

OTHER PUBLICATIONS

Kybartas et al., "Capacitive Sensor for Respiratory Monitoring," Conference "Biomedical Engineering," Nov. 2015, 6 pages.
Lapedus, "Electroplating IC Packages—Tooling challenges increase as advanced packaging ramps up," *Semiconductor Engineering*, https://semiengineering.com/electroplating-ic-packages, Apr. 10, 2017, 22 pages.
Materials and Processes for Electronic Applications, Series Editor: James J. Licari, AvanTeco, Whittier, California, Elsevier Inc., 2009, 20 pages.
Worhoff et al., "Flip-chip assembly for photonic circuits," MESA+ Research Institute, University of Twente, Integrated Optical MicroSystems Group, The Netherlands, 12 pages.
U.S. Appl. No. 17/373,167, filed Jul. 12, 2021, Bismuto et al.
U.S. Appl. No. 17/379,759, filed Jul. 19, 2021, Lee et al.
U.S. Appl. No. 17/386,297, filed Jul. 27, 2021, Tu et al.
U.S. Appl. No. 17/386,362, filed Jul. 27, 2021, Tu et al.
U.S. Appl. No. 17/407,016, filed Aug. 19, 2021, Hill et al.
U.S. Appl. No. 17/408,122, filed Aug. 20, 2021, Wu.
U.S. Appl. No. 17/470,916, filed Sep. 9, 2021, Arbore et al.

\* cited by examiner

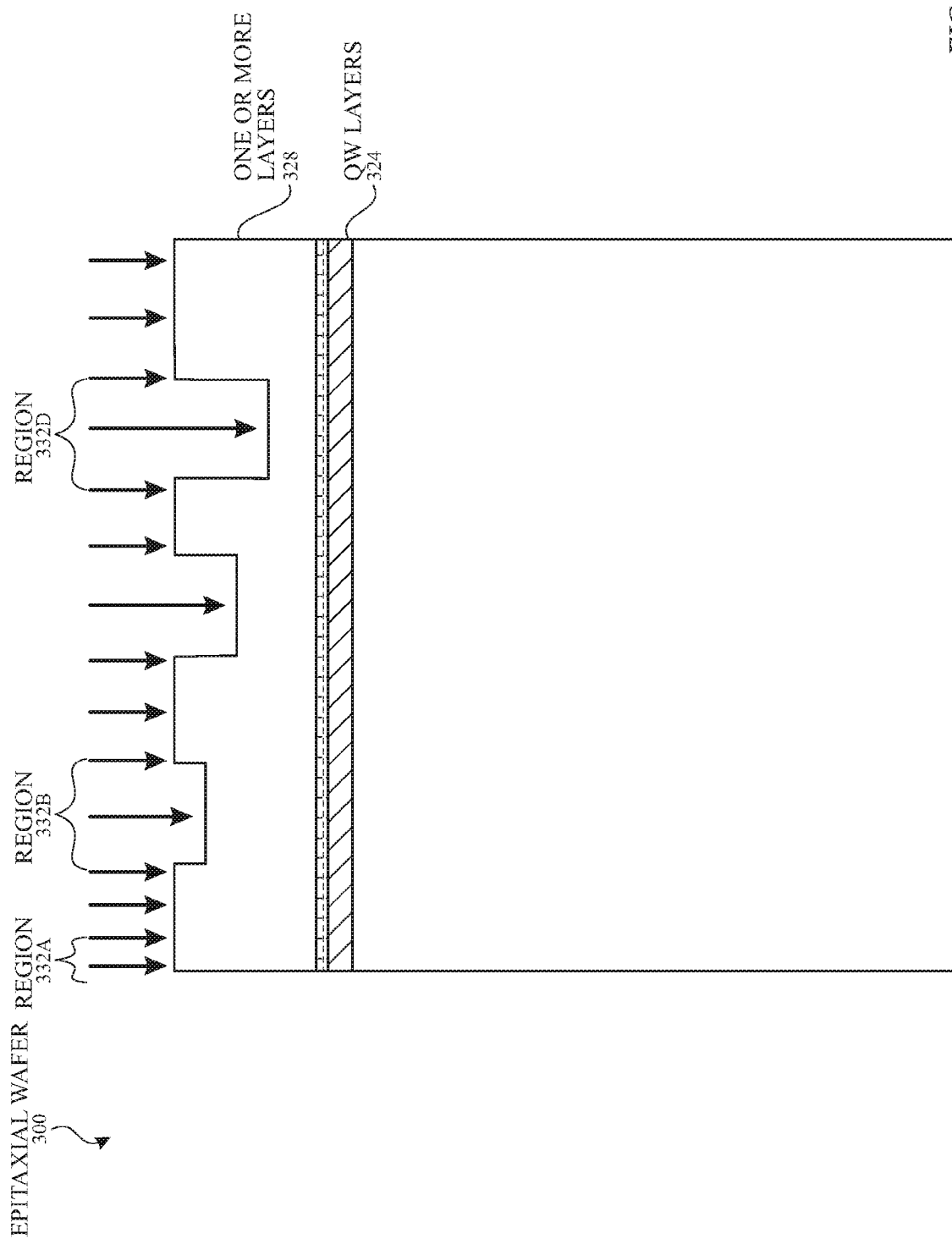

LASER ARCHITECTURES USING QUANTUM WELL INTERMIXING TECHNIQUES

CROSS-REFERENCE TO RELATED APPLICATIONS

This application is a continuation of U.S. patent application Ser. No. 16/649,965, filed Mar. 23, 2020, which is a national phase application under 35 U.S.C. § 371 of PCT/US2018/052679, filed Sep. 25, 2018, which claims the benefit of U.S. Provisional Patent Application No. 62/564,419, filed Sep. 28, 2017, the contents of which are incorporated by reference in their entirety as if fully disclosed herein.

FIELD

The disclosure is directed generally to a semiconductor laser formed using quantum well intermixing (QWI). More particularly, the disclosure is directed to a semiconductor laser chip including a plurality of QWI laser stripes having different optical gain shifts.

BACKGROUND

Semiconductor lasers can be useful for many applications, such as trace gas detection, environmental monitoring, biomedical diagnostics, telecommunications, and industrial process controls. Some applications can benefit from a system capable of emitting light across a wide range of wavelengths.

One way to achieve emissions across a wide range of wavelengths can be to include multiple laser chips in the system, where some or all laser chips can be configured to emit light at different wavelength ranges. In some instances, the range of wavelengths can be wider than the intrinsic gain bandwidth of a laser stripe (e.g., a quantum well epitaxial structure). Each laser chip can include a laser stripe and may be grown and engineered separately on an epitaxial wafer. The plurality of laser chips can collectively create a system capable of emitting different wavelengths. In some instances, growing laser chips on separate epitaxial wafers can increase the size, cost, and complexity of the system. One way to reduce the complexity and the number of epitaxial wafers included in the system can be to include a plurality of laser stripes on a laser chip, where some or all of the laser stripes can emit different wavelengths of light. One way to include a plurality of laser stripes of different wavelengths over a range that is wider than the intrinsic bandwidth of the laser chip can be to utilize an intermixing process on the same epitaxial wafer.

SUMMARY

Described here is a laser chip including a plurality of stripes. A laser stripe can be grown with an initial optical gain profile, and its optical gain profile can be shifted by using an intermixing process. In this manner, multiple laser stripes can be formed on the same laser chip from the same epitaxial wafer, where at least one laser stripe can have an optical gain profile shifted relative to another laser stripe. For example, each laser stripe can have a shifted optical gain profile relative to its neighboring laser stripe, thereby each laser stripe can emit light with a different range of wavelengths. The laser chip can emit light across a wide range of wavelengths. Examples of the disclosure further includes different regions of a given laser stripe having different intermixing amounts. For example, a laser stripe can have intermixed facets, where the facets can be located proximate to sub-regions along the active region that have a higher transition energy than the gain region (e.g., located between the facets). In some instances, the intermixed facets can be used to minimize the likelihood of changing the integrity at the laser facets. As another example, a laser stripe can have intermixed lateral regions located adjacent to the active region (e.g., along the ridge waveguide). The intermixed lateral regions may be separate from the active region and can have a different intermixing amount than the active region. In some instances, the intermixed lateral regions can be used to minimize optical losses and/or for potential increases in carrier confinement.

BRIEF DESCRIPTION OF THE DRAWINGS

FIG. 3C illustrates a cross-sectional view of an exemplary epitaxial wafer after etching the respective targeted number of layers according to examples of the disclosure.

DETAILED DESCRIPTION

Figure 1:
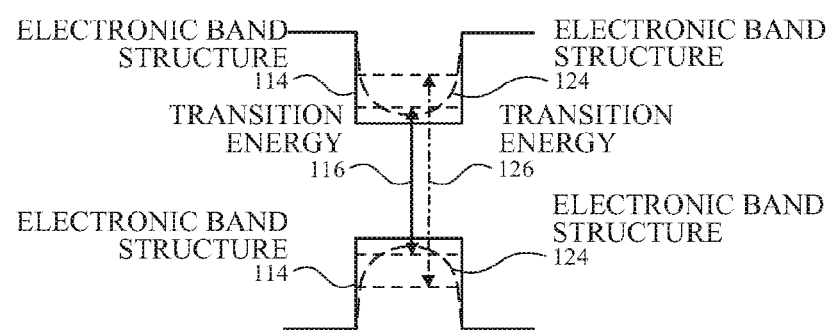
FIG. 1 illustrates exemplary band diagrams of quantum well (QW) and quantum well intermixed (QWI) lasers according to examples of the disclosure.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its description in a drawing does not imply that the illustrated process is exclusive of other variations and modification thereto, does not imply that the illustrated process or any of its steps are necessary to one or more of the examples, and does not imply that the illustrated process is preferred.

Semiconductor lasers can be useful for many applications, such as trace gas detection, environmental monitoring, biomedical diagnostics, telecommunications, and industrial process controls. Some applications can benefit from a system capable of emitting light across a wide range of wavelengths.

One way to achieve emissions across a wide range of wavelengths can be to include multiple laser chips in the system, where some or all laser chips can be configured to emit light at different wavelength ranges. In some instances, the range of wavelengths can be wider than the intrinsic gain bandwidth of a laser stripe (e.g., a quantum well epitaxial structure). Each laser chip can include a laser stripe and may be grown and engineered separately on an epitaxial wafer. The plurality of laser chips can collectively create a system capable of emitting different wavelengths. In some instances, growing laser chips on separate epitaxial wafers can increase the size, cost, and complexity of the system. One way to reduce the complexity and the number of epitaxial wafers included in the system can be to include a plurality of laser stripes on a laser chip, where some or all of the laser stripes can emit different wavelengths of light. One way to include a plurality of laser stripes of different wavelengths over a range that is wider than the intrinsic bandwidth of the laser chip can be to utilize an intermixing process on the same epitaxial wafer.

This disclosure relates to a laser chip including a plurality of stripes. A laser stripe can be grown with one or more materials having an initial optical property (e.g., optical gain profile), and its optical properties can be altered (e.g., the optical gain profile can be shifted) by using an intermixing process that changes the material properties. In this manner, multiple laser stripes can be formed on the same laser chip from the same epitaxial wafer, where the laser stripes have a common material. The intermixing process can change the material properties of at least one laser stripe such that its optical gain profile shifted relative to the optical gain profile of another laser stripe on the same epitaxial wafer. An intermixing process can be used to create different regions along the active region of a laser stripe having different transition energies and electronic band structures. For example, a laser stripe can have intermixed facets, where the facets can be located proximate to sub-regions along the active region and can have higher transition energies than the gain region (e.g., located between the facets). In some instances, the intermixed facets can be used to minimize the amount of optical absorption at the facets. Minimizing the amount of optical absorption can lessen the chances of changing the integrity (e.g., damage or impairing the ability of the laser strip to produce and emit light) of the laser facets. As another example, a laser stripe can have intermixed lateral regions located adjacent to the active region. The intermixed lateral regions may be separate from the active region and can have a different intermixing amount than the active region. In some examples, the active region of a laser stripe can include different regions having different amounts of intermixing. In some instances, the intermixed lateral regions can be used to minimize optical losses and/or for potential increases in carrier confinement.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

Semiconductor lasers can have many uses in portable or compact-sized electronic devices. Some applications may benefit from a system capable of emitting light across a wide range of wavelengths of interest. One way to achieve emissions across a wide range of wavelengths while reducing the complexity of the system can be to include multiple laser stripes on a laser chip, where one or more laser stripes can be configured to emit light at a different wavelength. Although each laser stripe may be grown and engineering separately on a different epitaxial wafer, some applications may benefit from a less complex system having a reduced number of epitaxial wafers.

One type of suitable semiconductor laser can be a quantum well (QW) laser. A QW laser can include a narrow bandgap material sandwiched between layers including material with a larger bandgap energy. The difference in bandgap energies can create a quantum well for confining electrons and holes. FIG. 1 illustrates exemplary band diagrams of QW and quantum well intermixed (QWI) lasers according to examples of the disclosure. The QW laser can have an electronic band structure 114 that includes a transition energy 116. The emission wavelength of a given laser can correspond to its transition energy, so engineering the confinement potential of the quantum well can change the emission wavelength of the laser.

One way to reduce the complexity and the number of epitaxial wafers included in the system can be to utilize an intermixing process to create multiple laser stripes from the same epitaxial wafer. The intermixing process can be a bandgap engineering technique where disorder can be introduced into the lattice structure to change the shape of the electronic band structure of the laser to the electronic band structure 124, as illustrated in FIG. 1. The process can cause different atoms in the quantum well structure to intermix. Exemplary processes can include, but are not limited to, ion implantation of a neutral species and diffusion of defects from a semiconductor-dielectric interface.

As illustrated in the figure, the intermixing process can lead to both a change in the shape of the electronic band structure and a change in the transition energy of the laser from the transition energy 116 to the transition energy 126. The larger transition energy 126 can cause the laser to emit shorter wavelength light. In this manner, a laser stripe can be grown with an initial optical gain profile, and its optical gain profile can be shifted by using the intermixing process.

Figure 2A:
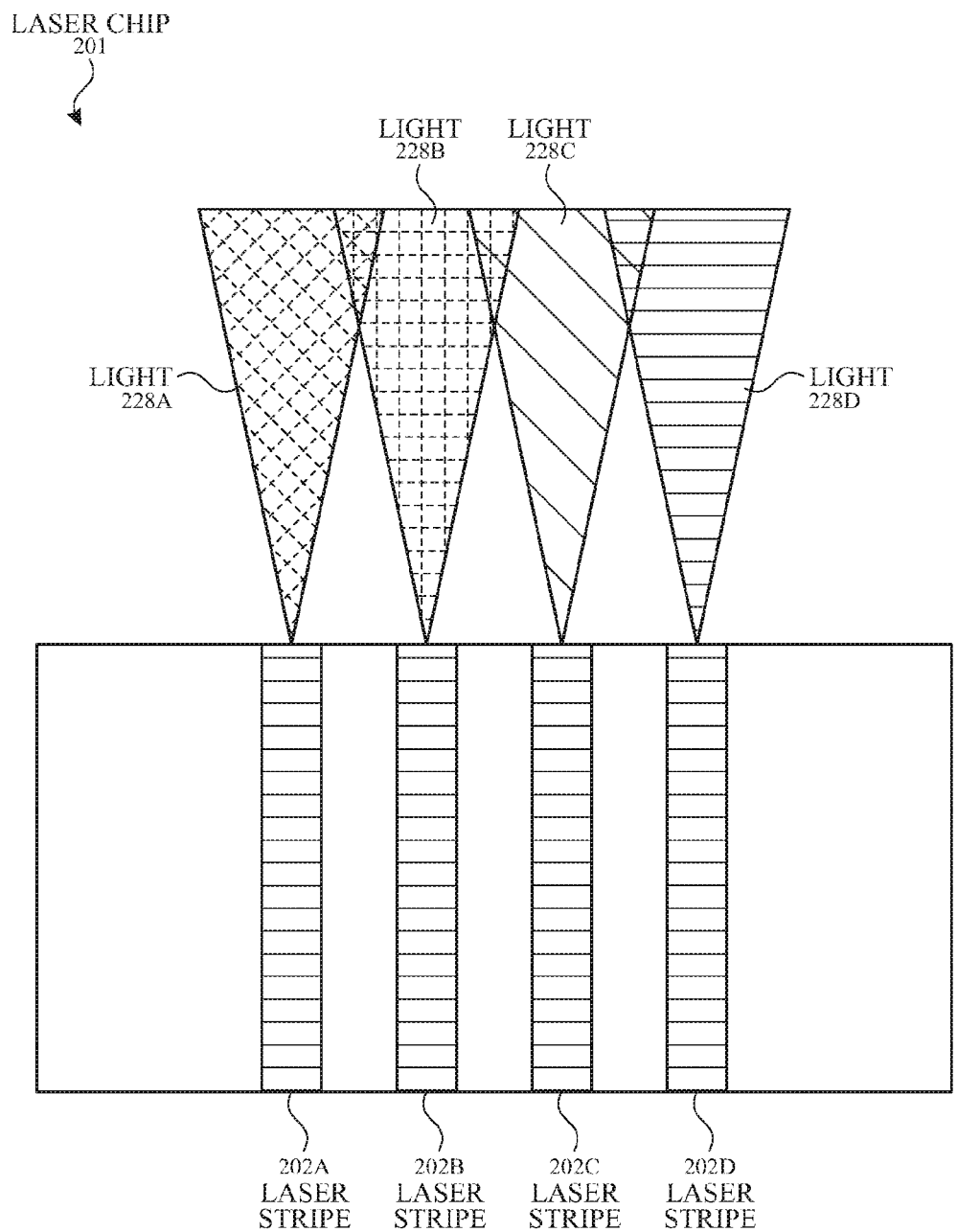
FIG. 2A illustrates a top view of a plurality of laser stripes included in an exemplary laser chip according to examples of the disclosure.
Figure 2B:
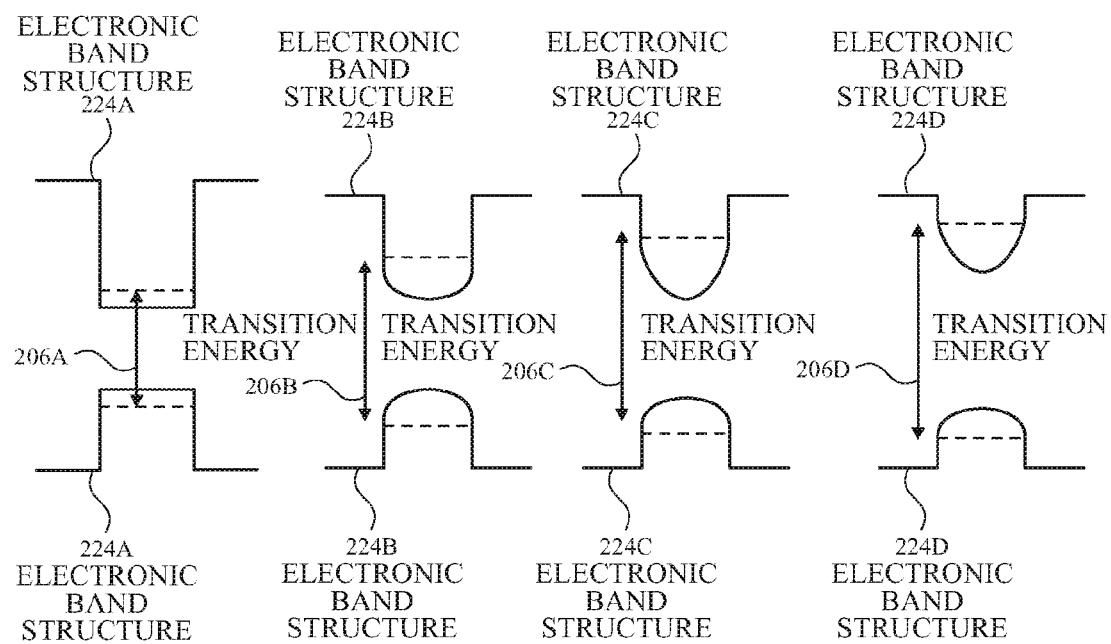
FIG. 2B illustrates electronic band structures corresponding to the plurality of laser stripes of FIG. 2A according to examples of the disclosure.

This relationship between intermixing and optical gain profile shift can be exploited to create multiple laser stripes on the same epitaxial wafer having different emission wavelengths. FIG. 2A illustrates a top view of a plurality of laser stripes included in an exemplary laser chip, and FIG. 2B illustrates corresponding electronic band structures according to examples of the disclosure. The laser chip 201 can include a plurality of laser stripes 202. In some examples, at least one laser stripe (e.g., laser stripe 202A) may not be exposed to the intermixing process. As a result, the laser stripe 202A can have the same band structure 224 as the as-grown epitaxial wafer (e.g., epitaxial wafer 300 illustrated in FIG. 3). The laser stripe 202A can emit light 228A (e.g., corresponding to optical gain profile 208A illustrated in FIG. 2C and discussed below) with transition energy 206A. In other instances, all of the laser stripes may be exposed to the intermixing process. As a result, the laser stripes (e.g., including the laser stripe 202A) can have a different band structure than the as-grown epitaxial wafer.

The laser stripe 202B can be a neighboring (e.g., adjacent) laser stripe with respect to the laser stripe 202A (and/or the laser stripe 202C) and can be exposed to the intermixing process. The laser stripe 202B can have a band structure 224B, which can differ from the band structure 224A, as illustrated in FIG. 2B, due to the intermixing process. The laser stripe 202B can emit light 228B (e.g., corresponding to optical gain profile 208B illustrated in FIG. 2C and discussed below) with transition energy 206B, the laser stripe 202C can emit light 228C (e.g., corresponding to optical gain profile 208C illustrated in FIG. 2C) with transition energy 206C, and the laser stripe 202D can emit light 228D (e.g., corresponding to optical gain profile 208D illustrated in FIG. 2C) with transition energy 206D.

One or more laser stripes (e.g., laser stripe 202C and laser stripe 202D) can have its electronic band structure undergo a change and its transition energy and emissions wavelength shifted relative to one or more other (e.g., neighboring) laser stripes. In some instances, the direction of the shift may differ between neighboring laser stripes (e.g., a shift to shorter wavelengths relative to one neighbor laser stripe and a shift to longer wavelengths relative to the other neighbor laser stripe). For example, the laser stripe 202C can have two neighboring laser stripes: the laser stripe 202B and the laser stripe 202D. The laser stripe 202C can include an optical gain profile 208C, which can have a maximum gain at a lower energy than the maximum gain of the optical gain profile 202D of another laser stripe 202D (shown in FIG. 2C). The optical gain profile 208C can also be shifted, but to a higher energy, with respect to the optical gain profile 208B of its other neighboring laser stripe 202B.

In some examples, the shifts may increase as the position of the laser stripe on the epitaxial wafer increases relative to an edge of the epitaxial wafer. That is, the distance between laser stripes may correspond to the amount of optical gain profile shift. For example, the laser stripe 202D can be located further away from the laser stripe 202A compared to the laser stripe 202C. The shift in the optical gain profile 208D from the optical gain profile 208A can be larger than the shift in the optical gain profile 208C from the same optical gain profile 208A. In other examples, the shifts of the optical gain profiles of different laser stripes can have a different (e.g., other than a gradient increase) pattern such as every other laser stripe can have a shifted optical gain profile.

One or more laser stripes 202 on the same epitaxial wafer can include the same type of materials. For example, each laser stripe 202 can include alternating layers of InGaAs and InP. The laser stripes can include one or more wavelength section methods including, but not limited to, a DFB laser, a DBR laser, a tunable laser, and a Fabry Perot laser. In this manner, a single epitaxial wafer can be grown for the laser chip 201 (discussed below). One or more (e.g., each) laser stripes 202 can be configured with a different transition energy than one or more other laser stripes 202 located on the same laser chip 201 by using the intermixing process. For example, the laser stripe 202A can be configured with transition energy 206A, and the laser stripe 202B can be configured with transition energy 206B. Both laser stripes can be grown from the same epitaxial wafer, but the transition energy 206A and the transition energy 206B can be different.

Although the figures illustrate a laser chip including four laser stripes having four different transition energies, examples of the disclosure can include any number of laser stripes and any number of transition energies. Additionally, examples of the disclosure are not limited to neighboring laser stripes having different optical gain profiles, but may include one or more laser stripes that may have the same optical gain profile as its neighboring laser stripe.

Figure 2C:
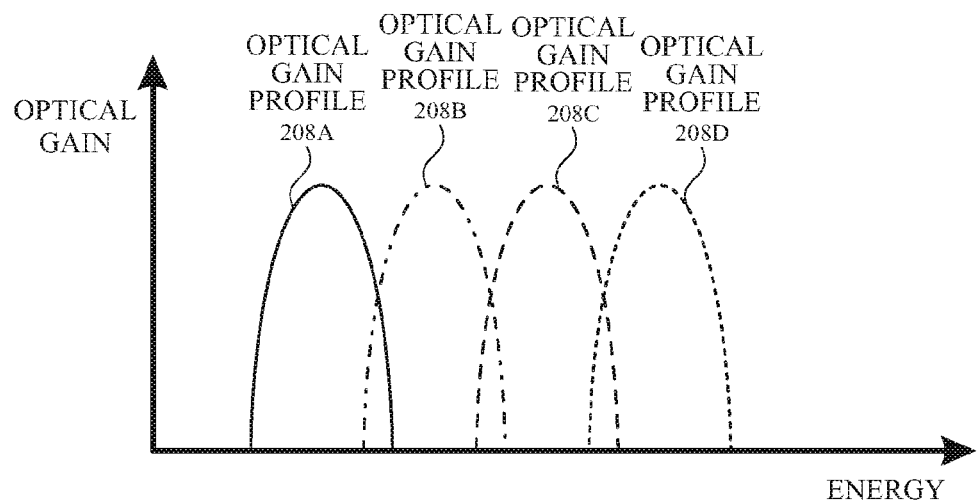
FIG. 2C illustrates exemplary gain profiles corresponding to the plurality of laser stripes of FIG. 2A according to examples of the disclosure.

In some examples, the collection of transition energies on the same epitaxial wafer can create a continuous span of wavelengths. FIG. 2C illustrates exemplary optical gain profiles corresponding to the plurality of laser stripes on the same epitaxial wafer according to examples of the disclosure. In some examples, each laser stripe 202 can have a different transition energy from the other laser stripes 202 on the same epitaxial wafer 200, thereby creating a laser chip capable of emitting at a plurality of wavelength ranges with a reduced number of epitaxial wafers and reduced complexity.

In some examples, two or more (e.g., neighboring) laser stripes can include portions of the gain profiles that overlap (e.g., one or more wavelengths are the same). For example, the laser stripe 202A and the laser stripe 202B can be neighboring laser stripes (e.g., laser stripes located adjacent to one another on the laser epi). The laser stripe 202A can include the optical gain profile 208A, and the laser stripe 202B can include optical gain profile 208B, where the optical gain profile 208A and the optical gain profile 208B can include adjacent or overlapping wavelength ranges. If extended across multiple lasers stripes, the system can be configured to emit light across a wide range of wavelengths, where the optical gains of at least two of laser stripes can allow the system to emit at any given wavelength across the range of wavelengths.

In some examples, shifting the optical gain profile of another (e.g., neighboring) laser stripe can include shifting each laser stripe to a shorter wavelength (i.e., longer transition energy) using the intermixing process. For example, a laser emitting at 680 nm can have transition energy of 1.8 eV. The emissions wavelength of a neighboring laser stripe can be shifted to a shorter wavelength (e.g., 610 nm) and larger transition energy (e.g., 2.0 eV) by using the intermixing process.

Figure 3A:
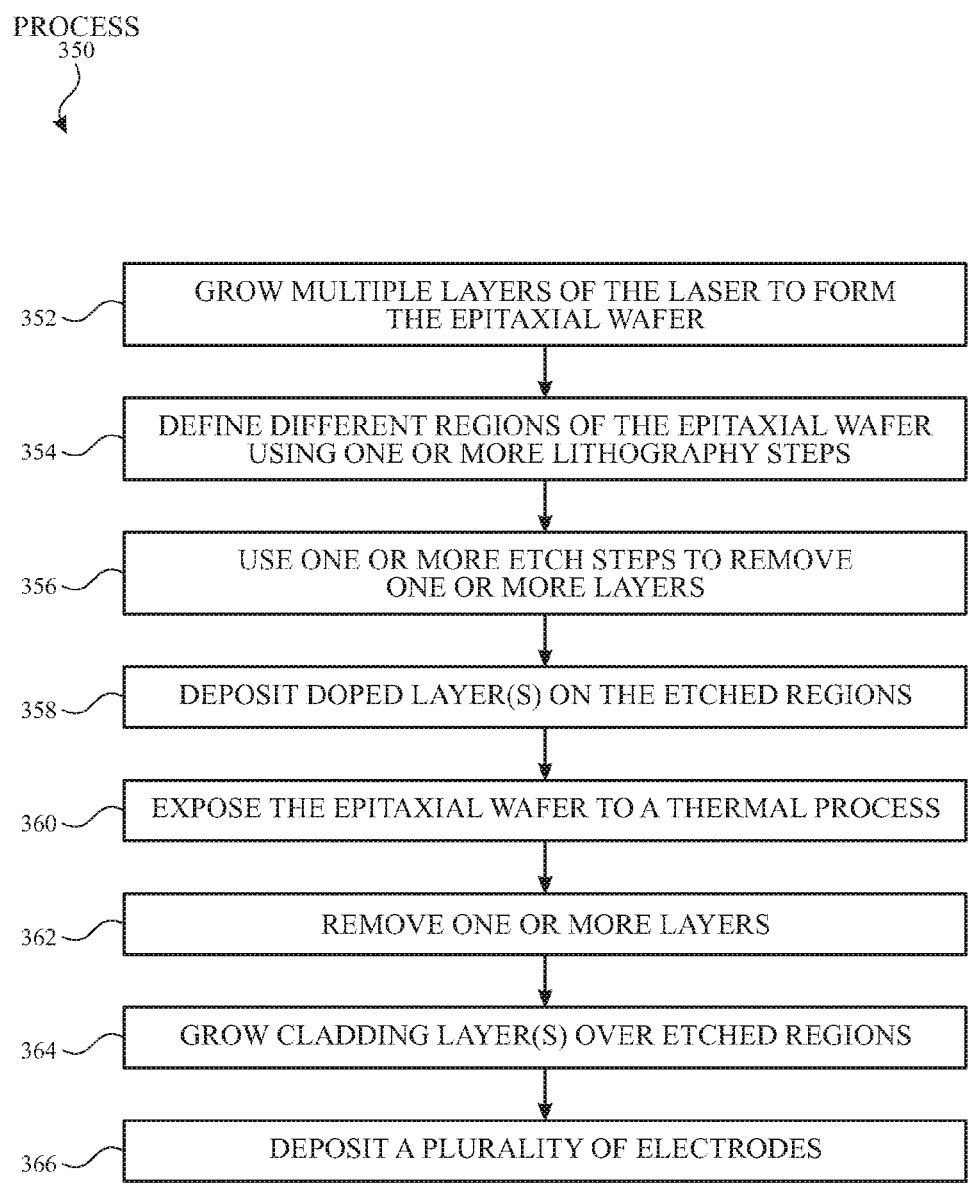
FIG. 3A illustrates an exemplary fabrication process for forming a laser chip according to examples of the disclosure.
Figure 3B:
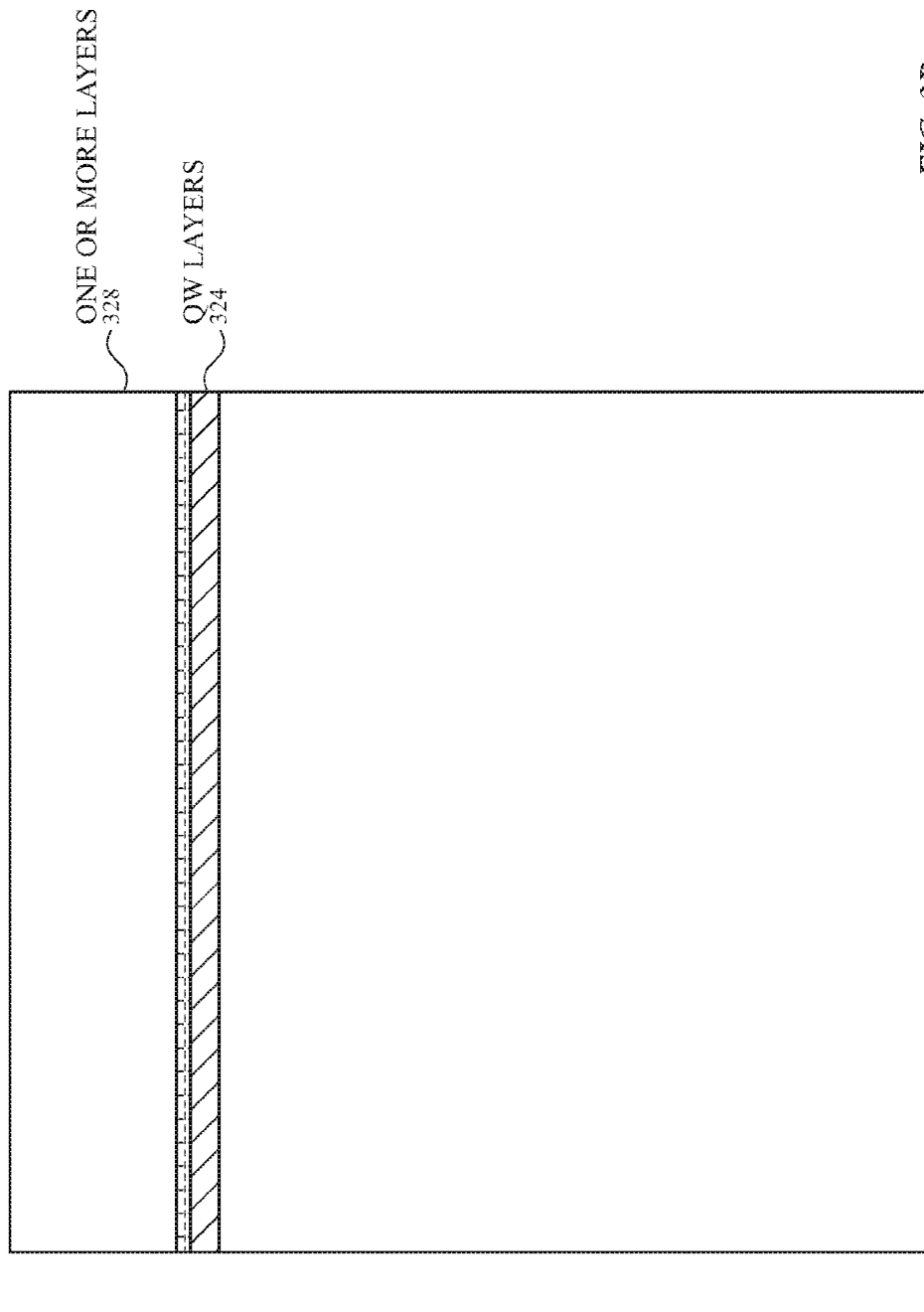
FIG. 3B illustrates a cross-sectional view of an exemplary epitaxial wafer according to examples of the disclosure.
Figure 3D:
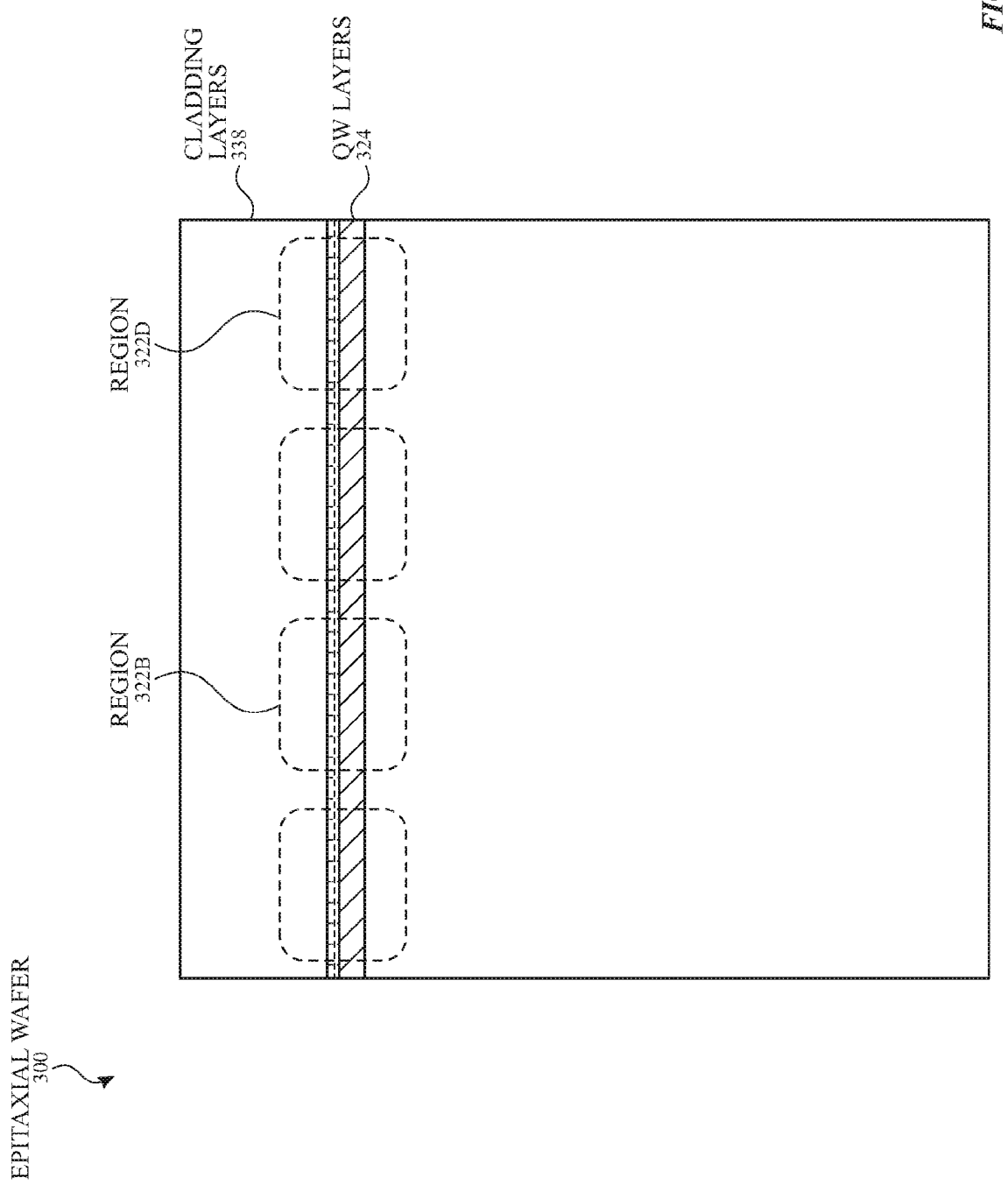
FIG. 3D illustrates a cross-sectional view of an exemplary epitaxial wafer after intermixing and after one or more cladding layers are grown according to examples of the disclosure.

FIG. 3A illustrates an exemplary fabrication process for forming a laser chip according to examples of the disclosure. FIGS. 3B-3D illustrate cross-sectional views of an exemplary laser chip at different steps in the fabrication process according to examples of the disclosure. Process 350 begins by growing multiple layers of the QW laser to form the epitaxial wafer (step 352 of process 350). The epitaxial wafer (e.g., epitaxial wafer 300) can be engineered to meet the optical properties of one or more laser stripes (e.g., laser stripe 202A illustrated in 2B). For example, the epitaxial wafer can be engineered to match the properties of the laser stripe which may not later be exposed to the intermixing process (discussed below). The growth can include growing one or more QW layers 324 and one or more layers 328, as illustrated in the cross-sectional view in FIG. 3B. The one or more layers 328 can include any layers included in a laser structure.

One or more lithography steps can be used to define different regions on the epitaxial wafer (step 354 of process 350). The etching process can include a plurality of etching steps. Each etch step can remove a targeted number of layers 328 from one or more regions 332 (step 356 of process 350). For example, the etching process can remove five layers 328 from the region 332D (illustrated in FIG. 3C). The number of layers 328 may differ for different regions 332. As another example, the etching process can remove one layer 328 from the region 332B, different from the region 332D (illustrated in FIG. 3C). In some examples, the etching process can include alternating between different selective etching steps, where one or more selective etches may have a higher preferential etch of one or more layers 328 over other layers 328. The number of layers 328 within a given region 332 can be used, at least in part, to control specific portions of the epitaxial wafer subject to the intermixing process. For example, a layer 328 can reduce the amount of intermixing (e.g., dopant diffusion). In some instances, one or more laser stripes can be unexposed laser stripes, which may not be subject to the intermixing process and instead can be masked (e.g., the layer 328 can block dopants from diffusing) while the other laser stripes can be intermixed.

To remove a different number of layers 328 in one region (e.g., region 332B) relative to another region (e.g., region 332D), one or more lithography steps may be included between etching steps. For example, a lithographic layer (e.g., photoresist) (not shown) can be deposited over regions 332A-332C, which can expose the region 332D such that the etching process can remove the layers 328 from region 332D, as illustrated in FIG. 3C. After the etch process, the lithographic layer can be removed. Another lithographic layer can be deposited over one or more different regions (e.g., regions 332A-332B). The layers 328 can be removed from at least one unexposed region (e.g., region 332C). The etching process can additionally layers 328 from at least another unexposed region (e.g., region 332D).

The etching process can continue until some or all of the regions 332 include the respective targeted number of layers 328, as illustrated in FIG. 3C. The targeted numbers can be based on the amount of intermixing. That is, different regions 332 can include different total thickness of the layers 328. For example, a greater number of layers 328 can be etched from region 332D relative to region 332B. In some instances, a lower number of layers 328 in the region 332D can allow a greater amount of intermixing for the region 332D. A greater amount of intermixing can increase the amount of disorder introduced in the epitaxial wafer at the region 332D, and the transition energy of the region 332D can be shifted by a greater amount than one or more other regions (e.g., regions 332A-332C).

One or more nominally undoped layers can be deposited on at least the etched regions (step 358 of process 350). The doped layer(s) can include one or more impurities. The epitaxial wafer 300 can be exposed to a thermal process (e.g., rapid thermal annealing) such that the impurities from the doped layer(s) can create disorder into the lattice structure of the QW layers 324 (step 360 of process 350). The doped layer(s) and the layers 328 can be removed (step 362 of process 350). One or more cladding layers 338 can be grown over the etched regions (step 364 of process 350), as shown in FIG. 3D. A plurality of electrodes (not shown) can be deposited (step 366 of process 350).

The QWI process discussed above can be used to change the amount of optical absorption in certain additional regions of the laser. One exemplary region of the laser that may benefit from a change in optical absorption may be the laser facets. For example, when the laser power density is high, the laser facets may absorb too much energy. A high amount of absorption can lead to heating at the laser facets, which can affect the integrity of the laser facets. In some instances, the likelihood of COD can be increased due to dangling bonds and point defects created by forming (e.g., cleaving and/or etching) the laser facets. To decrease the optical absorption such that the likelihood of COD is reduced, the laser facets can be configured with a larger transition energy using the intermixing process. The facets can become more transparent to light, reducing the absorption-induced heat, and increasing the laser's lifetime.

Figure 4:
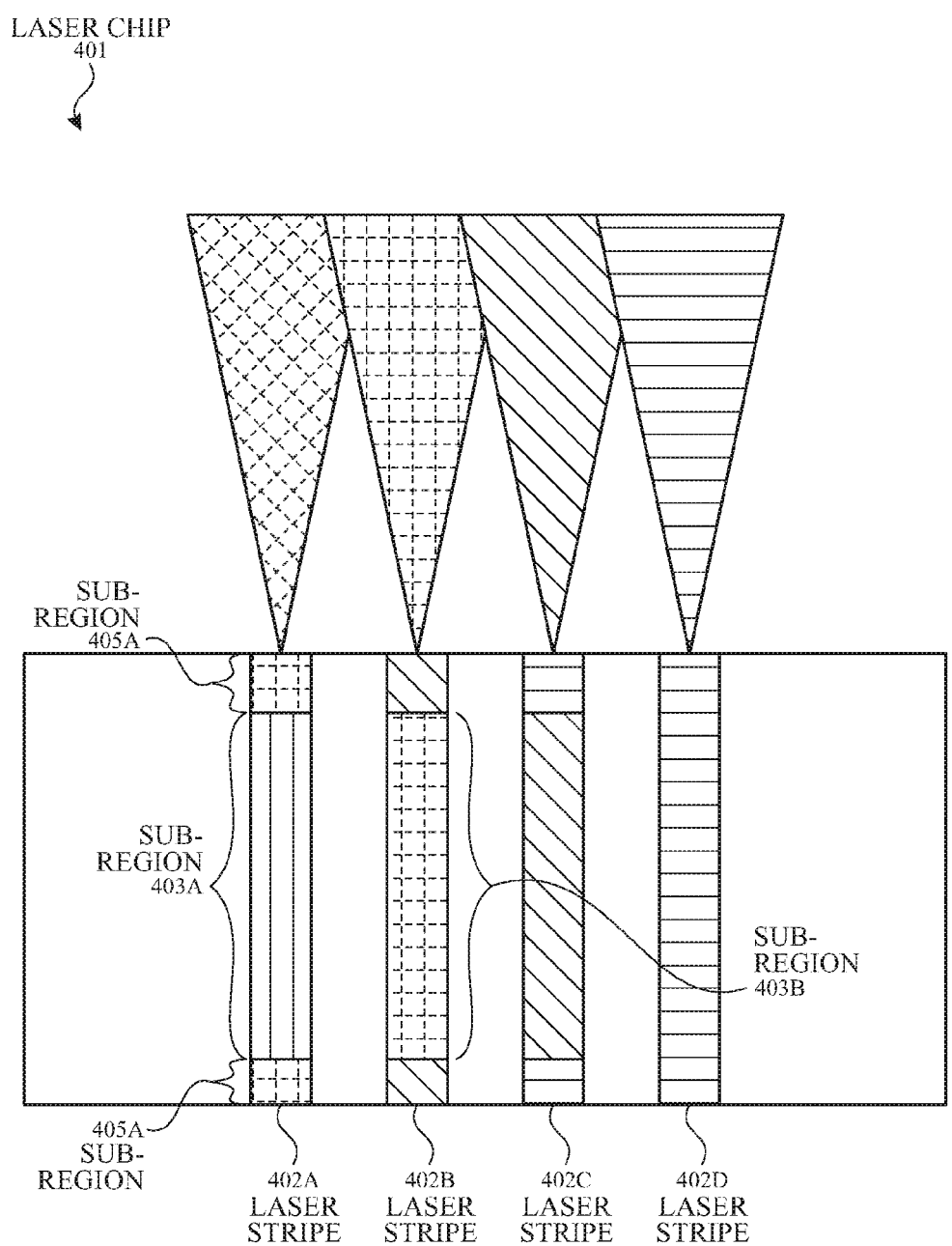
FIG. 4 illustrates a top view of a plurality of laser stripes included in an exemplary laser chip with intermixed laser facets according to examples of the disclosure.

FIG. 4 illustrates a top view of a plurality of laser stripes included in an exemplary laser chip with intermixed laser facets according to examples of the disclosure. The laser chip 401 can include a plurality of laser stripes 402, which can include one or more properties and/or functions similar to the plurality of laser stripes 202 discussed above. One of more laser stripes 402 can have waveguides including different sub-regions 403 and 405. For example, laser stripe 402A can include a sub-region 403A and sub-regions 405A. As used throughout this disclosure, a "sub-region" is a region along the active region of a laser (e.g., along the growth plane). The sub-region 403A can have a band structure (e.g., band structure 224A illustrated in FIG. 2B), and sub-regions 405A can have another band structure (e.g., band structure 224B illustrated in FIG. 2B). In some examples, the sub-regions 405 can be located at the facets of the respective laser stripe 402, and the sub-region 403 (e.g., a gain region) of the laser stripe can be located between the sub-regions 405. That is, the sub-regions of a given laser located closer to the laser facets can have larger transition energies than the sub-region of a given laser located in the region coinciding with the maximum gain of the laser.

In some examples, the sub-regions (e.g., sub-regions 405A) of a laser stripe (e.g., laser stripe 402A) can be configured with the same band structure as another sub-region (e.g., sub-region 403B) of another laser stripe, such as the neighboring laser stripe (e.g., laser stripe 402B). Examples of the disclosure can include all but one laser stripe (e.g., laser stripe 402D) having the intermixed facets. The laser stripe (e.g., laser stripe 402D) without intermixed facets can have the shortest emission wavelengths, for example, relative to the other laser stripes 402.

The process for intermixing the sub-regions corresponding to the laser facets can include patterning the lithographic layer (not shown) and implementing the etching process such that, during the intermixing process, the number of layers 228 in the sub-regions (e.g., sub-region 405A) is the same as in a sub-region (e.g., sub-region 403B) of another laser stripe (e.g., laser stripe 402B). The sub-regions of one laser stripe can undergo the same level of intermixing than another sub-region of another laser stripe. The other laser stripe can be any laser stripe on the same epitaxial chip including, but not limited to, a neighboring laser stripe.

Figure 5A:
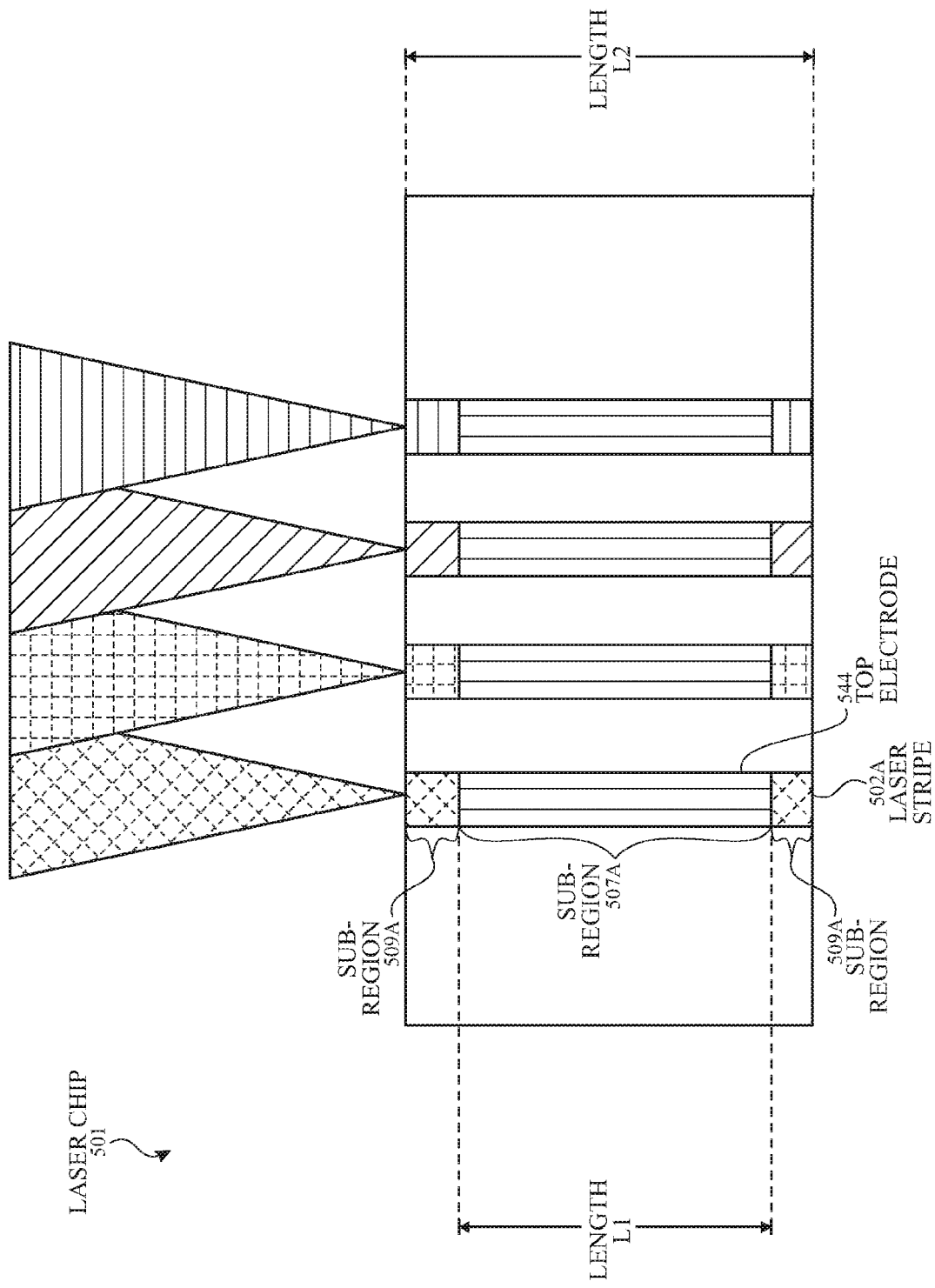
FIG. 5A illustrates a top view of an exemplary laser chip including reduced-sized top electrodes according to examples of the disclosure.

Additionally or alternatively, examples of the disclosure can include a top electrode having a smaller size than the ridge waveguide to minimize the likelihood of COD. FIG. 5A illustrates a top view of an exemplary laser chip including reduced-sized top electrodes according to examples of the disclosure. The laser chip 501 can include a plurality of laser stripes 502, which can include one or more properties and/or functions similar to the plurality of laser stripes 202 and/or the laser stripes 402 discussed above. The laser stripe 502A can include a sub-region 507A and sub-regions 509A. The sub-regions 509A may be located at or near the laser facets, and the sub-region 507A may be located at the gain region (e.g., a region coinciding with the maximum gain of the laser). The top electrodes 544 (i.e., the electrode located closer to the ridge waveguide) of one or more laser stripes 502 can be configured such that its length L1 (i.e., in the longitudinal direction) is less than the length L2 of the laser stripe 502. In some examples, the length L1 of the top electrode 544 can be the same as the length of the sub-region 507A. In this manner, fewer charge carriers can be injected in the vicinity of one or more laser facets (e.g., sub-regions 509A), which can reduce the amount of optical absorption at the laser facets. Due to the gain profile along the laser stripe (e.g., including an active region) having a maximum gain located away (e.g., in the center of the laser) from the laser facets, pumping the facet regions may not increase the performance of the laser stripe due to its transparency. As such, reducing the amount of pumping at the facet regions may reduce the likelihood of COD without a significant or any compromise in laser performance. Although the figure illustrates all four laser stripes as including reduced-sized top electrodes, examples of the disclosure can include reduced-sized top electrodes on less than all the laser stripes 502. For example, one laser stripe can include a reduced-sized top electrode, and another laser stripe may not.

Figure 5B:
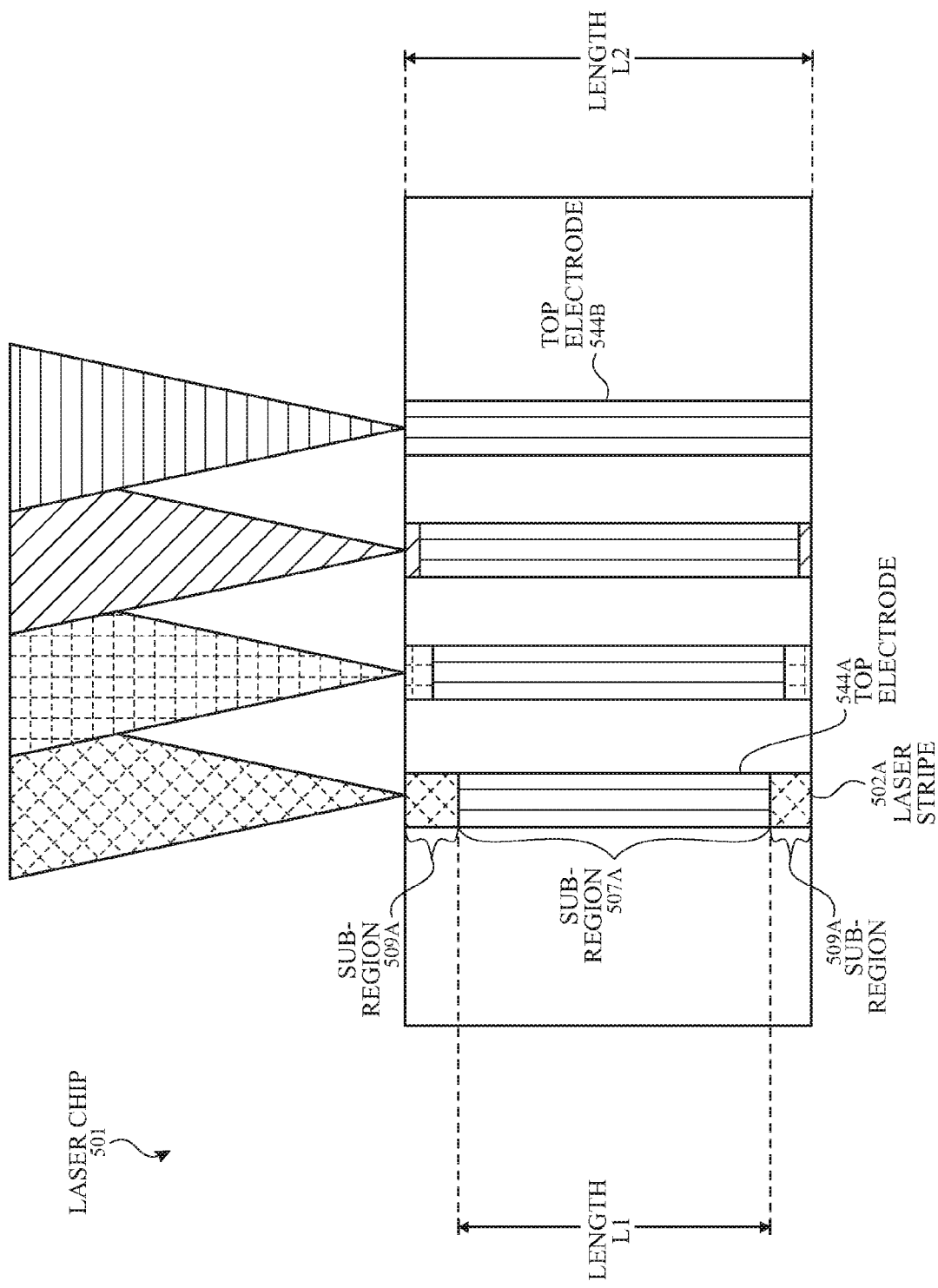
FIG. 5B illustrates a top view of an exemplary laser chip including at least two laser stripes with different electrode arrangements according to examples of the disclosure.

Additionally or alternatively, examples of the disclosure can include laser stripes having different lengths for the reduced-sized top electrodes. FIG. 5B illustrates a top view of an exemplary laser chip including at least two laser stripes with different electrode arrangements according to examples of the disclosure. In some instances, the electrode arrangements can be such that the lateral spacing from the edge of the electrode to the laser facet (e.g., associated with the length of the top electrode) can be based on the transition energy of the laser stripe (e.g., and/or the transition energy of gain region of the laser stripe). For example, the laser stripe 502D can have larger transition energies than the laser stripe 502A. Due to the larger transition energy, the facets of the laser stripe 502D may be more susceptible to COD due to the higher optical absorption. In some examples, the laser stripe (e.g., the laser stripe 502D) having the larger transition energy can include a top electrode 554B having a longer length (e.g., length L2) than the top electrode 554A of a laser stripe having a smaller transition energy (e.g., laser stripe 502A having a top electrode with a shorter length L1). In some examples, all but one laser stripe (e.g., laser stripe 502D) can have the same electrode arrangement. In some examples, the lengths for the top electrodes can vary gradually (e.g., can be based on the transition energy), as illustrated in the figure. Examples of the disclosure further include one or more laser stripes configured with both intermixed facets (as discussed in the context of FIG. 4) and reduced-spacing top electrodes (as discussed in the context of FIG. 5A).

Figure 6A:
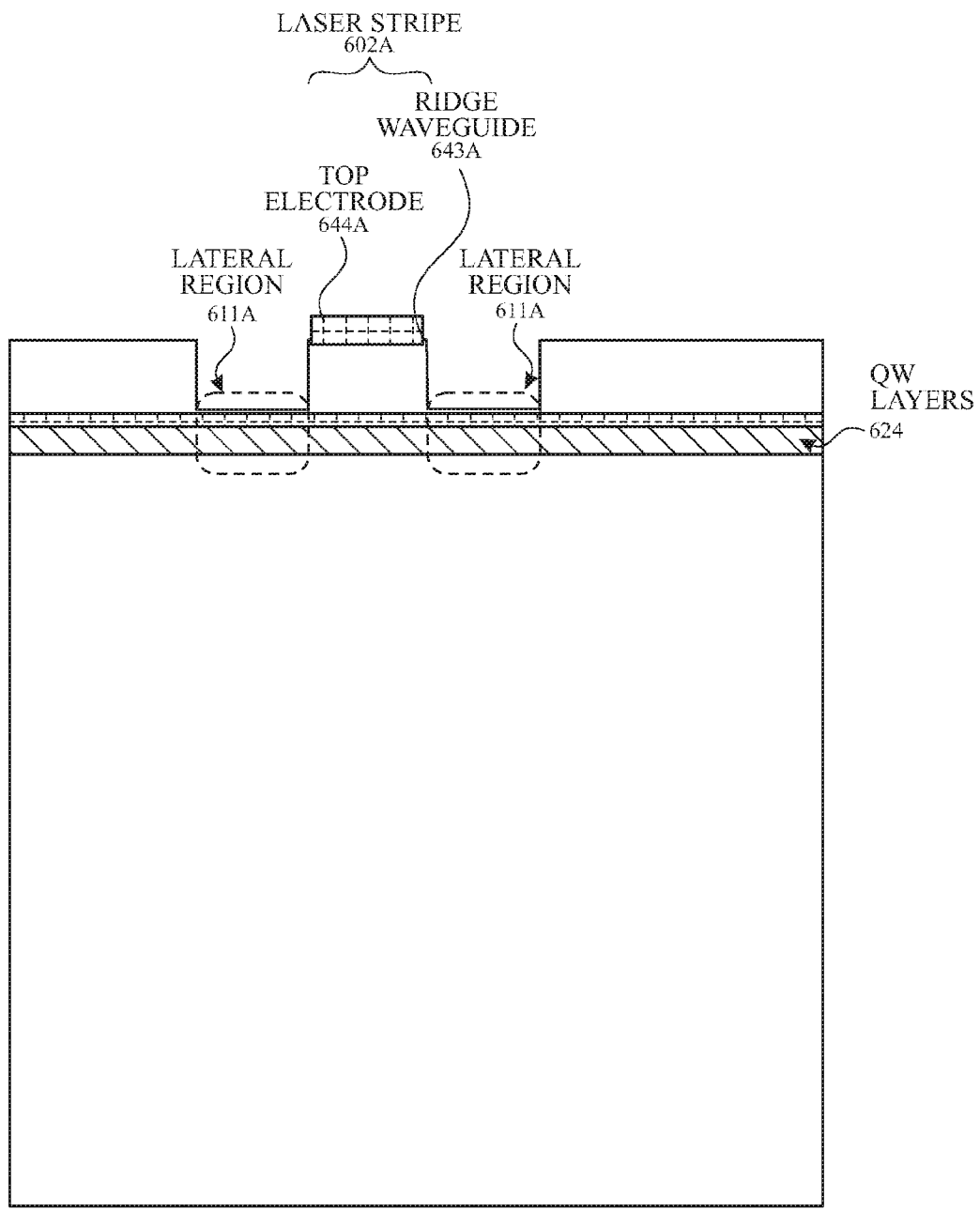
FIG. 6A illustrates a cross-sectional view of an exemplary laser stripe and corresponding lateral regions according to examples of the disclosure.

In some instances, one or more regions of the laser may be associated with higher losses. FIG. 6A illustrates a cross-sectional view of an exemplary laser stripe and corresponding lateral regions according to examples of the disclosure. The laser stripe 602A can include a ridge waveguide 643A and a top electrode 644A electrically coupled to the ridge waveguide 643A. The ridge waveguide 643A can be located between the lateral regions 611A. In some examples, the lateral regions 611A can include QW layers 624 and can absorb light, which may cause an increase in loss and a decrease in laser quantum efficiency.

Figure 6B:
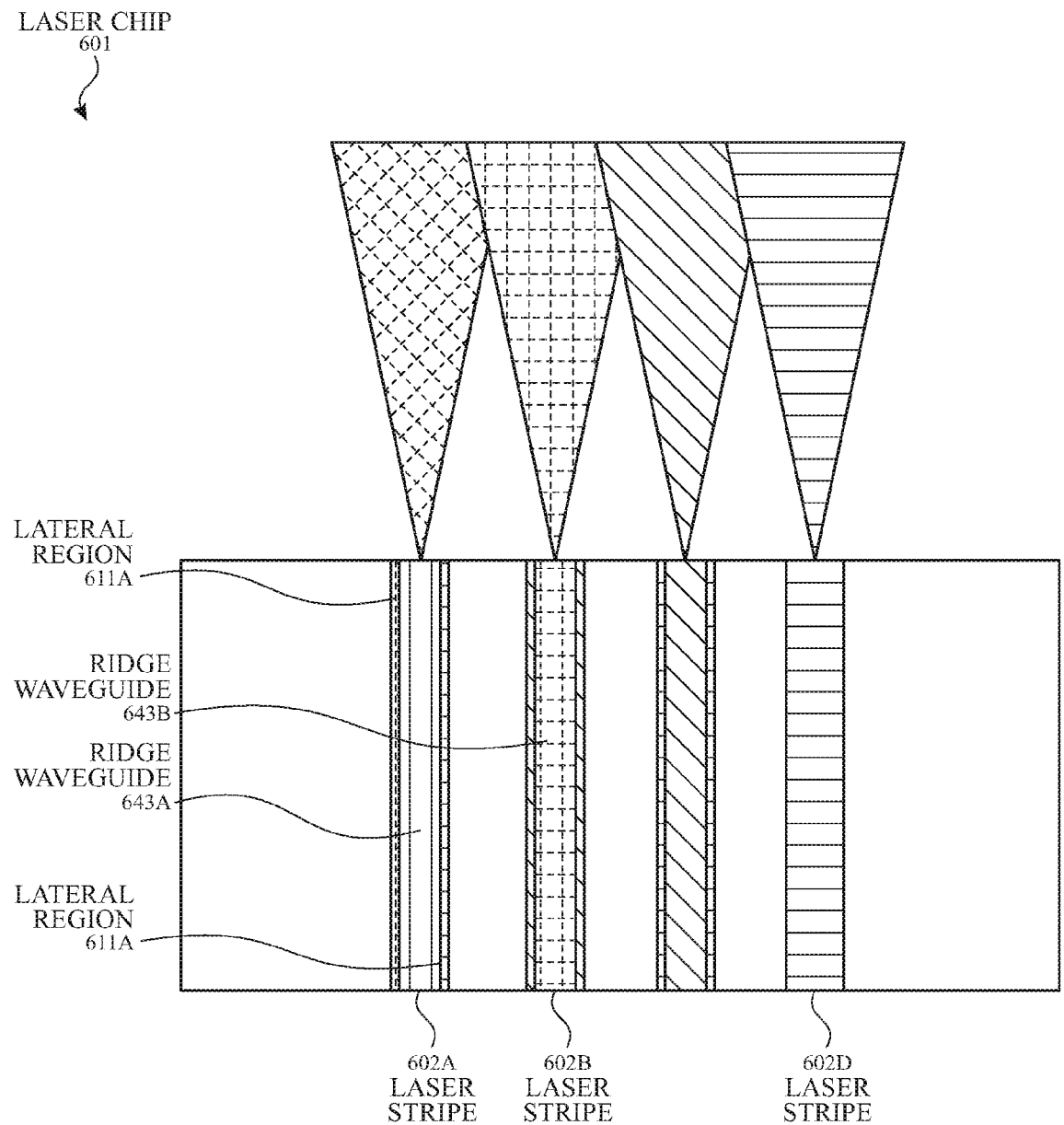
FIG. 6B illustrates a top view of an exemplary laser chip with intermixed lateral regions according to examples of the disclosure.

Examples of the disclosure can include utilizing the intermixing process for one or more regions (e.g., lateral regions 611) around the ridge waveguide (e.g., ridge waveguide 643) and/or active region. FIG. 6B illustrates a top view of an exemplary laser chip with intermixed lateral regions according to examples of the disclosure. The laser chip 601 can include a plurality of laser stripes 602, which can include one or more properties and/or functions similar to the plurality of laser stripes 202, laser stripes 402, and/or laser stripes 502 discussed above. One or more laser stripes (e.g., laser stripe 602A) can have lateral regions (e.g., lateral regions 611A) located next to their waveguides (e.g., ridge waveguide 643A) and/or active region. The ridge waveguide 643A can have a band structure (e.g., band structure 224A illustrated in FIG. 2B), and one or more lateral regions 611A can have a different band structure (e.g., band structure 224B illustrated in FIG. 2B). In some examples, the lateral regions (e.g., lateral regions 611A) can be configured with the same band structure as the ridge waveguide (e.g., ridge waveguide 643B) of another laser stripe, such as its neighboring laser stripe (e.g., laser stripe 602B). Examples of the disclosure can include all but one laser stripe (e.g., laser stripe 602D) having the intermixed lateral regions. The laser stripe (e.g., laser stripe 602D) without the intermixed lateral regions can have the shortest emission wavelengths, for example, relative to the other laser stripes 602. In some examples, the system can operate the laser stripe without the intermixed lateral regions differently (e.g., higher injection current) to compensate for differences (e.g., higher) in loss (relative to the laser stripes having intermixed lateral regions).

The process for intermixing the lateral regions can include patterning the lithographic layer (not shown) and implementing the etching process such that the number of layers (e.g., layers 328 illustrated in FIG. 3B) in the lateral regions (e.g., lateral regions 611A) is the same as the ridge waveguide (e.g., ridge waveguide 643A) of the neighboring laser stripe (e.g., laser stripe 602B). The lateral regions of one laser stripe can undergo the same level of intermixing as the ridge waveguide of another laser stripe.

Figure 7:
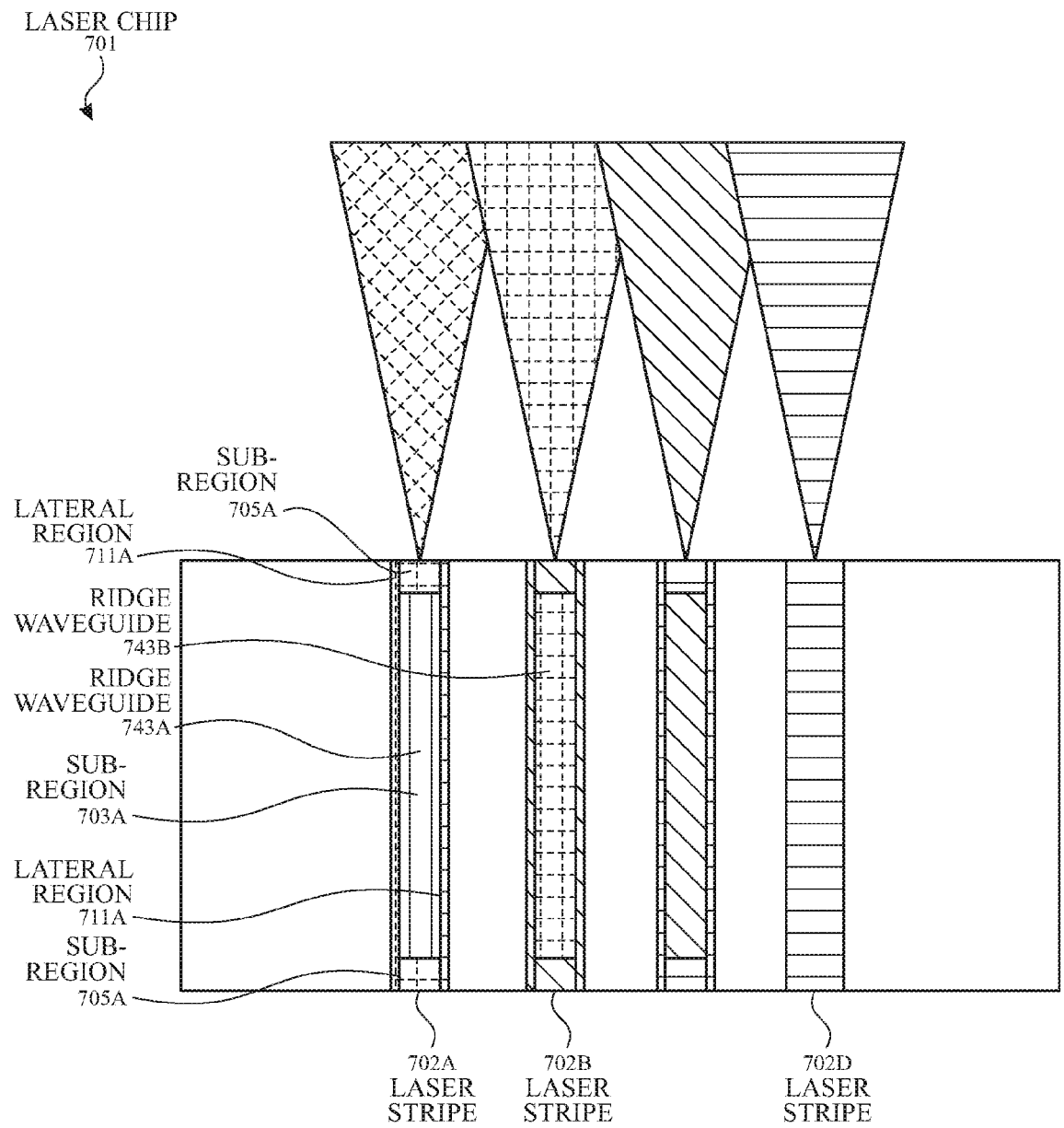
FIG. 7 illustrates a top view of an exemplary laser chip including laser stripes configured with both intermixed facets and intermixed lateral regions according to examples of the disclosure.

Examples of the disclosure further include one or more laser stripes configured with one or more of the combinations of above disclosed examples: intermixed facets (as discussed in the context of FIG. 4), reduced-spacing top electrodes (as discussed in the context of FIGS. 5A-5B), and intermixed lateral regions (as discussed in the context of FIGS. 6A-6B). For example, FIG. 7 illustrates a top view of an exemplary laser chip including laser stripes configured with both intermixed facets and intermixed lateral regions according to examples of the disclosure. The laser chip 701 can include a plurality of laser stripes 702, which can include one or more properties and/or functions similar to the plurality of laser stripes 202, laser stripes 402, laser stripes 502, and/or laser stripes 602 discussed above. One or more laser stripes 702 can have waveguides including different sub-regions 703 and 705. For example, the laser stripe 702A can include a sub-region 703A and sub-regions 705A. The sub-region 703A can have a band structure (e.g., band structure 224A illustrated in FIG. 2B), and sub-regions 705A can have a different band structure (e.g., band structure 224B illustrated in FIG. 2B). In some examples, the sub-regions 705 can be located at the facets of the respective laser stripe 702, where the sub-region 703 (e.g., a gain region) of the laser stripe can be located between the sub-regions 705. In some examples, sub-regions (e.g., sub-regions 705A) of a laser stripe (e.g., laser stripe 702A) can be configured with the same band structure as the gain region (e.g., sub-region 703B) of a neighboring laser stripe (e.g., laser stripe 702B). The sub-region 703A may coincide with the ridge waveguide 743A, in some instances.

The ridge waveguide 743A can be located between the lateral regions 711A. The ridge waveguide 743A can have a band structure (e.g., band structure 224A illustrated in FIG. 2B), and one or more lateral regions 711A can have a different band structure (e.g., band structure 224B illustrated in FIG. 2B). In some examples, the lateral regions (e.g., lateral regions 711A) can be configured with the same band structure as the ridge waveguide (e.g., ridge waveguide 743A) of a neighboring laser stripe (e.g., laser stripe 702B). In some examples, two or more of the sub-regions 705 (e.g., intermixed facet regions) of a given laser, the lateral regions 711 of the same laser, and the sub-region 703 (e.g., gain region) of the neighboring laser can have the same band structure.

Examples of the disclosure can include all but one laser stripe (e.g., laser stripe 702D) having the intermixed lateral regions. Additionally or alternatively, the same (or a different) laser stripe may not have intermixed facet regions. In some instances, the lateral regions 711 may laterally surround the ridge waveguide 743 (and/or active region), and the sub-regions 705 may longitudinally surround the ridge waveguide 743 (and/or active region). Additionally or alternatively, the laser chip can include one or more laser stripes configured with the reduced-sized top electrodes, as discussed above. The process for intermixing the respective regions can include patterning the lithographic layer based on different regions for intermixing.

Figure 8C:
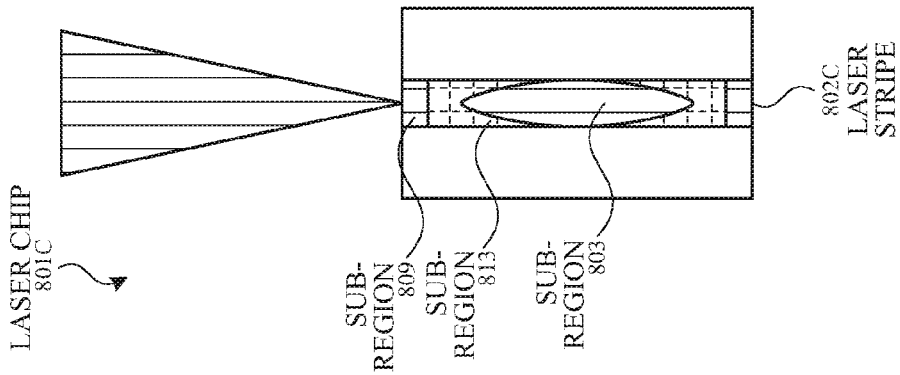
FIG. 8C illustrates a laser stripe configured with the intermixed facets and shaped interfaces.
Figure 8B:
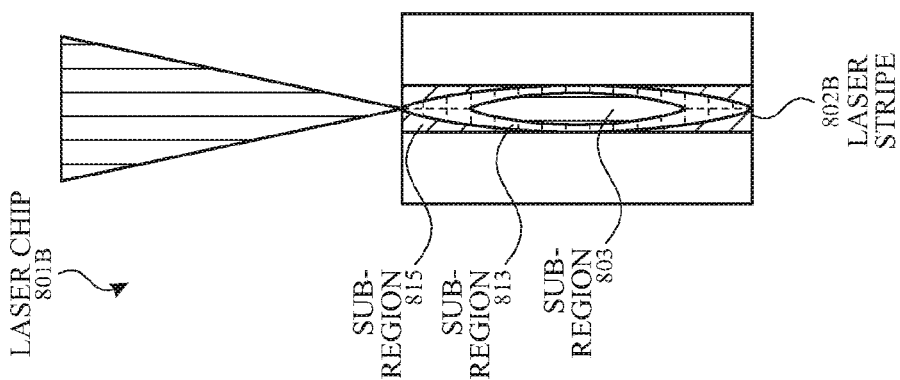
FIG. 8B illustrates a top view of an exemplary laser chip including a laser stripe with multiple regions having different levels of intermixing according to examples of the disclosure.
Figure 8A:
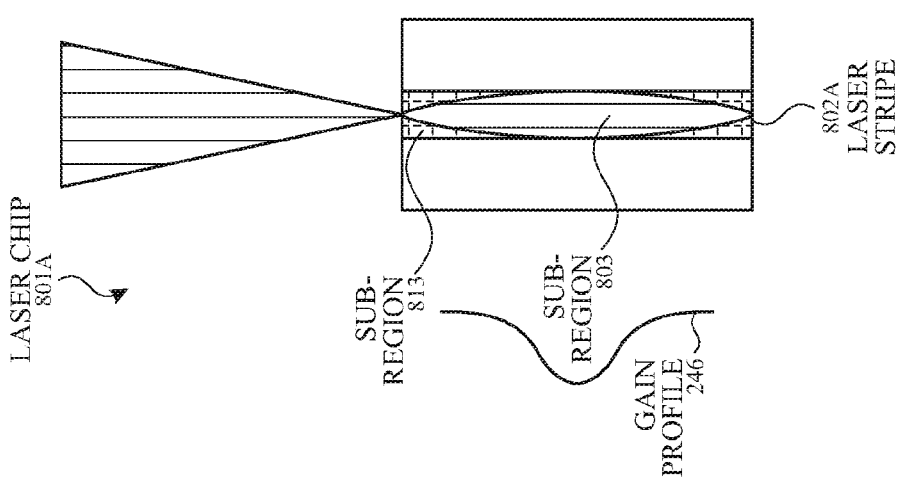
FIG. 8A illustrates a top view of an exemplary laser chip including a laser stripe with different intermixed regions, where the regions can be based on the shape of the gain profile according to examples of the disclosure.

In some examples, different regions for intermixing can be configured based on the shape of the gain profile of a laser stripe. FIGS. 8A-8C illustrate top views of exemplary laser chips including different regions for intermixing based on the shape of the gain profile according to examples of the disclosure. For example, the laser chip 801A can include the laser stripe 802A. The laser stripe 802A can include a plurality of sub-regions such as sub-region 803 and sub-region 813 along its active region, as illustrated in FIG. 8A. The sub-region 803 and the sub-region 813 can be exposed to different levels of intermixing during the fabrication process and can have different band structures. For example, the sub-region 803 may not be exposed to intermixing and may have a band structure similar to the band structure 224A illustrated in FIG. 2B. The sub-region 813 can be exposed to intermixing, can have transition energies greater than the sub-region 803, and/or can have a band structure similar to band structure 224B illustrated in FIG. 2B. The lateral intermixed "shaping" can help control the mode of the laser stripe.

The locations where the sub-region 803 and the sub-region 813 meet may lead to a shape (e.g., non-rectangular) that reflects the optical gain profile (e.g., the optical gain profile 208A illustrated in FIG. 2C) of the laser stripe 802A. In some examples, the shape of the interface can complement the optical mode of the laser stripe 802A. Since the gain near the facets (i.e., gain tail) can be small (e.g., nearly zero), pumping the regions near the facet may lead to higher optical absorption. The laser stripe 802A can be configured such that sub-region 813 (e.g., the region located closer to the edges of the active region) has a different (e.g., higher) transition energy than sub-region 803.

Examples of the disclosure can include the laser stripe configured with multiple sub-regions having different levels of intermixing, as illustrated in FIG. 8B. The laser chip 801B can include the laser stripe 802B. The laser stripe 802B can include the sub-region 803, the sub-region 813, and the sub-region 815 along its active region. The sub-region 815 can be exposed to a greater amount of intermixing than the sub-region 813, which can be exposed to a greater amount of intermixing than the sub-region 803. For example, the sub-region 803 can have band structure 224A (illustrated in FIG. 2B), the sub-region 813 can have band structure 224B (illustrated in FIG. 2B), and the sub-region 815 can have band structure 224C (illustrated in FIG. 2B). That is, for a given laser stripe, the transition energy can increase closer to the edges of its active region. The interface between the sub-region 803 and the sub-region 813 and/or the interface between the sub-region 813 and the sub-region 815 can have a shape based on the gain profile of the laser stripe 802B. In some examples, one or more sub-regions (e.g., sub-region 813 and/or sub-region 815) may not be pumped regions, while other sub-regions (e.g., sub-region 803) may be pumped regions.

Examples of the disclosure further include one or more laser stripes configured with one or more of the combinations of the above disclosed examples: intermixed facets (as discussed in the context of FIG. 4), reduced-spacing top electrodes (as discussed in the context of FIGS. 5A-5B), intermixed lateral regions (as discussed in the context of FIGS. 6A-6B), interfaces between sub-regions having a shape based on the gain profile (as discussed in the context of FIG. 8A), and multiple levels of intermixing for the same laser stripe (as discussed in the context of FIG. 8B). For example, FIG. 8C illustrates a laser stripe configured with the intermixed facets (e.g., at sub-region 809) and shaped interfaces (e.g., at sub-region 803 and sub-region 813).

In some examples, the shape of the top electrode can be based on the gain profile. In this manner, pumping the laser stripe in regions (e.g., the facets) where there is little to no gain can prevent or reduce depletion in regions (e.g., the longitudinal center) where there is gain. In some instances, the laser may not be pumped homogeneously throughout the active region.

A laser chip is disclosed. The laser chip may comprise: a plurality of laser stripes including at least one laser stripe, the at least one laser stripe including: one or more first sub-regions along an active region of the at least one laser stripe, the one or more first sub-regions including a first transition energy, and one or more second sub-regions along the active region, the one or more second sub-regions including a second transition energy and a second dopant amount, wherein the second transition energy is different from the first transition energy, wherein the one or more first sub-regions and the one or more second sub-regions include the same epitaxial wafer. Additionally or alternatively, in some examples, the laser chip further comprises: an unexposed laser stripe, the unexposed laser stripe including a third transition energy, wherein the third transition energy is the same as a transition energy of the epitaxial wafer. Additionally or alternatively, in some examples, the one or more first sub-regions are located proximate to facets of the at least one laser stripe, and the one or more second sub-regions are located proximate to a gain region of the at least one laser stripe. Additionally or alternatively, in some examples, the plurality of laser stripes includes another laser stripe, wherein the second transition energy of the one or more second sub-regions of the another laser stripe is the same as the first transition energy of the one or more first sub-regions of the at least one laser stripe. Additionally or alternatively, in some examples, the first transition energy of the one or more first sub-regions is larger than the second transition energy of the one or more second sub-regions. Additionally or alternatively, in some examples, the laser chip further comprise: one or more electrodes disposed along the active regions of the plurality of laser stripes, wherein for the at least one laser stripe: the electrode of the at least one laser stripe has a first length along the active region of the at least one laser stripe, the active region of the at least one laser strip has a second length, wherein the first length is less than the second length. Additionally or alternatively, in some examples, the plurality of laser stripes includes another laser stripe, wherein the electrode of the another laser stripe has a third length along the active region of the another laser stripe, the third length different from the first and the second lengths. Additionally or alternatively, in some examples, the third length is longer than the first length, and wherein the second transition energy of the another laser is larger than the second transition energy of the at least one laser stripe. Additionally or alternatively, in some examples, the one or more first sub-regions of the at least one laser stripe include the active region of the at least one laser stripe, and wherein the one or more second sub-regions of the at least one laser stripe include lateral regions located adjacent to the active region of the at least one laser stripe. Additionally or alternatively, in some examples, the plurality of laser stripes includes another laser stripe, wherein the second transition energy of the one or more second sub-regions of the another laser stripe is the same as the first transition energy of the one or more first sub-regions of the at least one laser stripe. Additionally or alternatively, in some examples, the second transition energy of the one or more second sub-regions of the at least one laser stripe is larger than the first transition energy of the one or more first sub-regions of the at least one laser stripe. Additionally or alternatively, in some examples, the one or more first sub-regions and the one or more second sub-regions of the at least one laser stripe are both located on the active region of the at least one laser stripe. Additionally or alternatively, in some examples, the first transition energy of the one or more first sub-regions is larger than the second transition energy of the one or more second sub-regions, and wherein the one or more first sub-regions are located closer to edges of the active region of the at least one laser than the one or more second sub-regions. Additionally or alternatively, in some examples, the plurality of laser stripes includes another laser stripe, and wherein an optical gain profile of the another laser stripe is shifted relative to an optical gain profile of the at least one laser stripe. Additionally or alternatively, in some examples, the one or more first sub-regions and the one or more second sub-regions include different amounts of intermixing.

A method of fabricating a laser chip is disclosed. The method may comprise: forming a plurality of laser stripes, wherein forming the plurality of laser stripes includes: growing an epitaxial wafer; and intermixing at least one laser stripe, wherein the intermixing includes: intermixing one or more first sub-regions along an active region of the at least one laser stripe to a first amount; intermixing one or more second sub-regions along the active region of the at least one laser stripe to a second amount, the second amount different from the first amount. Additionally or alternatively, in some examples, growing the epitaxial wafer includes growing a plurality of layers, the method further comprising: removing one or more of the plurality of layers, from the one or more first sub-regions of the at least one laser stripe, wherein the one or more first sub-regions are located proximate to facets of the at least one laser stripe; and removing one or more of the plurality of layers from the one or more second sub-regions of the at least one laser stripe, wherein the one or more second sub-regions are located proximate to a gain region of the at least one laser stripe. Additionally or alternatively, in some examples, growing the epitaxial wafer includes growing a plurality of layers, the method further comprising: removing one or more of the plurality of layers from the one or more first sub-regions of the at least one laser stripe, wherein the one or more first sub-regions include the active region of the at least one laser stripe; and removing one or more of the plurality of layers from the one or more second sub-regions of the at least one laser stripe, wherein the one or more second sub-regions are lateral regions located adjacent to the active region of the at least one laser stripe. Additionally or alternatively, in some examples, growing the epitaxial wafer includes growing a plurality of layers, the method further comprising: removing one or more of the plurality of layers from the one or more first sub-regions of the at least one laser stripe; and removing one or more of the plurality of layers from the one or more second sub-regions of the at least one laser stripe, wherein the one or more first sub-regions are located closer to edges of the active region of the at least one laser stripe than the one or more second sub-regions. Additionally or alternatively, in some examples, forming the plurality of laser stripes further includes: intermixing another laser stripe, wherein the intermixing includes: intermixing one or more second sub-regions along the active region of the another laser to the first amount. Additionally or alternatively, in some examples, growing the epitaxial wafer includes growing a plurality of layers, the method further comprising: masking an unexposed laser stripe with the grown plurality of layers while the at least one laser stripe is being intermixed.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. A laser chip comprising:
a first laser stripe including:
a first sub-region of the first laser stripe; and
a second sub-region of the first laser stripe,
wherein a band structure of the first sub-region is different than a band structure of the second sub-region; and
a second laser stripe including:
a third sub-region along an active region of the second laser stripe; and
a fourth sub-region along the active region of the second laser stripe,
wherein a band structure of the third sub-region is different than a band structure of the fourth sub-region
wherein at least two of the first sub-region, the second sub-region, the third sub-region, or the fourth sub-region are configured with the same band structure; and
wherein the first sub-region, the second sub-region, the third sub-region, and the fourth sub-region each include a corresponding region of a set of quantum well layers.

2. The laser chip of claim 1, wherein:
the first laser stripe comprises:
a first facet at a first end of the first laser stripe;
a second facet at a second end of the first laser stripe;
the first sub-region includes:
a first band structure is located at the first facet and the second facet; and
the second sub-region is positioned between the first facet and the second facet.

3. The laser chip of claim 1, wherein:
the second laser stripe comprises:
a third facet at a first end of the second laser stripe;
a fourth facet at a second end of the second laser stripe;
the third sub-region includes:
a third band structure located at the third facet and the fourth facet;
the fourth sub-region is positioned between the third facet and the fourth facet;
the fourth sub-region has the same band structure as the first sub-region.

4. The laser chip of claim 1, wherein the second sub-region is located at a region coinciding with a maximum gain of the first laser stripe.

5. The laser chip of claim 1, wherein:
the laser chip further comprises a third laser stripe including:
a fifth sub-region along an active region of the third laser stripe; and
a sixth sub-region along the active region of the third laser stripe,
a band structure of the fifth sub-region is different than a band structure of the sixth sub-region.

6. The laser chip of claim 5, further comprising a fourth laser stripe including a region with the same band structure as the fifth sub-region of the third laser stripe.

7. The laser chip of claim 6, wherein the sixth sub-region has the same band structure as the third sub-region.

8. The laser chip of claim 7, wherein each of the laser stripes of the laser chip emit light at different wavelengths.

9. A laser chip, comprising:
an epitaxial wafer;
a first laser stripe on the epitaxial wafer, including:
a first facet at a first end of the first laser stripe and having a first band structure;
a second facet at a second end of the first laser stripe and having the first band structure;
a first sub-region located between the first and second facet and having a second band structure
a second laser stripe on the epitaxial wafer, including:
a third facet at a first end of the second laser stripe and having a third band structure;
a fourth facet at a second end of the second laser stripe and having the third band structure;
a second sub-region located between the third and fourth facet and having a fourth band structure, wherein:
the first laser stripe emits light at a first wavelength; and
the second laser stripe emits light at a second wavelength.

10. The laser chip of claim 9, wherein:
the first band structure is different than the second band structure;
the third band structure is different than the fourth band structure; and
the third band structure is the same as the first band structure.

11. The laser chip of claim 9, wherein:
the laser chip includes:
a third laser stripe on the epitaxial wafer; and
a fourth laser stripe on the epitaxial wafer;
the third laser stripe includes a third sub-region positioned between a fifth facet and a sixth facet;
the fourth laser strip includes a fourth sub-region positioned between a seventh facet and an eighth facet;
the fifth and sixth facets have a fifth band structure; and
the third sub-region has a sixth band structure.

12. The laser chip of claim 11, wherein the epitaxial wafer has a seventh band structure, and the fourth sub-region has an eighth band structure that is the same as the same seventh band structure.

13. The laser chip of claim 12, wherein each of the seventh facet and the eighth facet has a corresponding band structure that is the same as the seventh band structure.

14. The laser chip of claim 11, wherein:
the first laser stripe includes a first top electrode; and
the first top electrode has the same length as the first sub-region.

15. The laser chip of claim 14, wherein:
the second laser stripe includes a second top electrode; and
the second top electrode has a length greater than the second sub-region.

16. The laser chip of claim 15, wherein:
the third laser stripe includes a third top electrode; and
the third top electrode has the same length as the total length of the third sub-region, the fifth facet, and the sixth facet.

17. A method of providing an intermixed laser architecture, comprising:
forming a first laser stripe, including:
a first intermixed sub-region; and
a second intermixed sub-region;
forming a second laser stripe, including:
a third intermixed sub-region; and
a fourth intermixed sub-region, wherein:
the first intermixed sub-region is generated with a different intermixing amount than the second intermixed sub-region;

the third intermixed sub-region is generated with a different intermixing amount than the fourth intermixed sub-region; and the fourth intermixed sub-region is generated with the same intermixing amount as the first intermixed sub-region.

18. The method of claim 17, wherein:

the method further comprises:

forming a third laser stripe, including:

a fifth intermixed sub-region; and a sixth intermixed sub-region;

forming a fourth laser stripe, including a seventh intermixed sub-region; and generating the seventh intermixed sub-region with the same intermixing amount as an epitaxial wafer.

19. The method of claim 17, wherein:

the method further comprises:

forming a third laser stripe, including:

a fifth intermixed sub-region; and a sixth intermixed sub-region;

forming the first laser stripe causes the first laser stripe to shift to a shorter wavelength than the second laser stripe; and forming the third laser stripe causes the third laser stripe to shift to a longer wavelength than the second laser stripe.

20. The method of claim 17, wherein the first laser stripe and the second laser stripe are on a same epitaxial wafer.

\* \* \* \* \*